United States Patent
Kienzle et al.

(10) Patent No.: US 7,135,677 B2
(45) Date of Patent: Nov. 14, 2006

(54) BEAM GUIDING ARRANGEMENT, IMAGING METHOD, ELECTRON MICROSCOPY SYSTEM AND ELECTRON LITHOGRAPHY SYSTEM

(75) Inventors: Oliver Kienzle, Aalen (DE); Rainer Knippelmeyer, Aalen (DE); Stephan Uhlemann, Heidelberg (DE); Max Haider, Gaiberg (DE); Heiko Müller, Heidelberg (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 221 days.

(21) Appl. No.: 10/638,328

(22) Filed: Aug. 12, 2003

(65) Prior Publication Data

US 2004/0084621 A1 May 6, 2004

(30) Foreign Application Priority Data

Aug. 13, 2002 (DE) .......................... 102 37 141

(51) Int. Cl.
*H01J 37/141* (2006.01)
*H01J 37/28* (2006.01)

(52) U.S. Cl. ................... 250/310; 250/396 R
(58) Field of Classification Search ......... 250/310, 250/396 R
See application file for complete search history.

(56) References Cited

U.S. PATENT DOCUMENTS

| 4,376,249 A | 3/1983 | Pfeiffer et al. |
| 4,740,704 A | 4/1988 | Rose et al. |
| 5,021,670 A | 6/1991 | Lanio et al. |
| 5,221,844 A | 6/1993 | van der Mast et al. |
| 5,578,821 A | 11/1996 | Meisberger et al. |
| 5,986,269 A | 11/1999 | Krijn et al. |
| 6,184,975 B1 | 2/2001 | Henstra et al. |
| 6,236,052 B1 | 5/2001 | Krijn |
| 6,323,499 B1 | 11/2001 | Muraki et al. |
| 6,326,629 B1 | 12/2001 | Krijn |
| 6,329,659 B1 | 12/2001 | Krijn et al. |
| 2001/0010357 A1 | 8/2001 | Ose et al. |
| 2002/0067482 A1 | 6/2002 | Lanio et al. |
| 2003/0066961 A1 | 4/2003 | Kienzle et al. |

FOREIGN PATENT DOCUMENTS

| EP | 1 182 684 A2 | 2/2002 |
| EP | 1 280 184 A2 | 1/2003 |
| JP | 62160648 | 7/1987 |
| JP | 01236568 A | 9/1989 |
| JP | 11283547 A | 10/1999 |
| JP | 2001076659 A | 3/2001 |
| JP | 2001076659 | * 3/2001 |

OTHER PUBLICATIONS

Zach et al. ("Efficient Detection of Secondary Electrons in Low–voltage Scanning Electron Microscopy, " SCANNING, vol. 8, pp. 285–294, 1986, FACM, Inc.).*

Joachim Zach, et al. "*Aberration correction in a low voltage SEM by a multipole corrector,*" Nuclear Instruments and Methods in Physics Research A, vol. 363, pp. 316–325, (1995), Elsevier Science B.V.

(Continued)

*Primary Examiner*—Nikita Wells
*Assistant Examiner*—James J. Leybourne
(74) *Attorney, Agent, or Firm*—Jones Day

(57) ABSTRACT

An electron microscopy system comprises an objective lens (19) which images a field displaceable in x-direction on a fixed beam axis (17). The objective lens has an astigmatic effect which is compensated for by a beam shaper (63) on the fixed axis. Furthermore, lens configurations can selectively act on the primary electron beam or the secondary electron beam.

44 Claims, 18 Drawing Sheets

OTHER PUBLICATIONS

J. Zach, et al. *"Efficient Detection of Secondary Electrons in Low–Voltage Scanning Electron Microscopy,"* SCANNING, vol. 8, pp. 285–293, (1986), FACM, Inc.

Eiichi Goto et al., *"MOL (Moving objective lens) Formulation of deflective aberration free system,"* OPTIK, vol. 48, No. 3, pp. 255–270 (1977), Wissenschaftliche Verlagsgesellschaft mbH, Stuttgart, Germany.

Schmid, Peter et al., "Outline of a Variable–Axis Lens with Arbitrary Shift of the Axis in One Direction", Journal of Vacuum Science and Technology, B, Microelectronics and Nanometer Structures Processing, Measurement and Phenomena, American Institute of Physics, New York, NY, US, Bd. 19, Nr. 6, Nov. 2001, Seiten 2555–2565 XP012009084, ISSN: 1071–1023.

Moonen, D. et al., "Design of an Electron Projection System with Slider Lenses and Multiple Beams", Proceedings of SPIE, Bd. 4688, Jul. 5, 2002, XP002328504, p. 935, last section.

* cited by examiner

BEAM GUIDING ARRANGEMENT, IMAGING METHOD, ELECTRON MICROSCOPY SYSTEM AND ELECTRON LITHOGRAPHY SYSTEM

This application is based upon DE 102 37 141.5 filed on Aug. 13, 2002, the entire contents of which are incorporated herein by reference.

BACKGROUND OF THE INVENTION

1. Field of the Invention

The present invention relates to beam guiding systems, imaging methods, an electron microscopy system and an electron lithography system.

2. Brief Description of Related Art

Conventional electron microscopy systems include electron microscopes of the SEM type (scanning electron microscope), of the SEEM type (secondary electron emission microscope) or of the LEEM type (low energy electron microscope).

In electron microscopes of the SEM type, a finely focused probe-forming primary electron beam is scanned across the object surface, and an integral secondary electron intensity is detected dependent upon the position of the finely focused primary electron beam on the object plane in order to obtain an electron-optical image of the object.

In electron microscopes of the SEEM-type and LEEM type, respectively, an extended region or field is illuminated on the object surface by a primary electron beam, and secondary electrons emanating from this field are imaged by means of an electron optics on a position-sensitive detector in an image-preserving manner in order to obtain an electron-optical image of the object on the detector.

An advantage of the SEM-type microscope is that a resolution of the image is only restricted by a focusing quality of the primary electron beam. A disadvantage of the SEM type microscope is a low throughput at a high resolution imaging since the object surface has to be scanned point-by-point or pixel-by-pixel, respectively.

An advantage of the LEEM-type and SEEM-type microscopes, respectively, lies in the possibility to simultaneously obtain image information of an extended region or field. A disadvantage of the same is a limitation of the resolution by a quality of the imaging optics. The quality of such imaging optics decreases with increasing extension of the imaged field.

In an electron microscopy system according to co-pending US 2003/0066961 A1, a displaceable extended field of the object surface is imaged on a position-sensitive detector.

FIG. 1 schematically shows such electron microscopy system 1. It is used to image an object 5 positioned in an object plane 3 of the microscopy system 1 onto a position-sensitive detector 7. To this end, the microscopy system 1 comprises a microscopy optics 11 which provides a beam path for secondary electrons in order to electron-optically image a region 13 of the object plane 3 onto the detector 7. The region 13 which is imaged onto the detector 7 is displaceable with respect to an optical axis 17 of the microscopy optics 11, a possible displacement of the region 13 from the optical axis 17 being designated by M in FIG. 1.

The secondary electrons emanating from the region 13 are formed to a secondary electron beam 14 which is supplied to the detector 7 by the microscopy optics 11. To this end, the microscopy optics comprises plural components centered on optical axis 17, namely an objective lens 19, a field lens 21 and a further magnification optics 23. Between the objective lens 19 and the field lens 21, there are disposed two beam deflectors 25 and 27 spaced apart from each other along the optical axis 17. They are controlled by a controller 29 to each provide an adjustable deflection angle of a value β for the secondary electron beam 14. However, the deflection angles provided by the two beam deflectors 25 and 27 are opposite in sign so that the secondary electron beam 14 passes straightly through the two beam deflectors, but with an adjustable displacement M.

The secondary electrons are released from the object 5 by a primary electron beam 33 which is generated by an electron source 35, collimated by a collimating lens 37, shaped by an aperture stop 39 and supplied to a beam splitter/combiner 41. The beam splitter/combiner 41 superimposes a beam path of the primary electron beam 33 with a beam path of the secondary electron beam 14. The primary electron beam 33 passes through the field lens 21, the beam deflectors 25, 27 and the objective lens 19. The primary electron beam 33 is also deflected by the deflectors 25, 27, but not necessarily at exactly the same angles β as the secondary electron beam 14. Rather, it is sufficient for the primary electron beam 33 to illuminate the field 13 which is imaged on the detector 7 merely fairly homogeneously. Accordingly, the demands on the imaging properties of the optical system 11 for the primary electron beam 33 are less restrictive than the demands on the imaging properties of the optical system 11 for the secondary electron beam 14.

The objective lens 19 provides a focusing field for the secondary electron beam 14, the optical axis 31 of the focusing field being displaceable relative to the otpical axis 17. The controller 29 controls the objective lens 19 such that the optical axis 31 thereof coincides with the beam displacement M provided by the beam deflectors 25, 27 and such that the optical axis 31 centrally intersects the region imaged on the detector 7, respectively.

An example of a magnetic round lens having a laterally displaceable axis is disclosed in the article by Goto et al., "MOL (Moving Objective Lens)", Optic 48 (1977), pages 255 et seq., or in U.S. Pat. No. 4,376,249.

In such MOL lens a maximum displacement M of a large extended field 13 is small due to a limited structural volume of the lens and a limited working distance between the object plane and the MOL lens. Therefore, a combination of a "comb lens" and a slit lens was proposed in order to imitate a round lens field having an optical axis which is displaceable over greater distances.

Such an objective lens 19 formed to imitate a displaceable round lens field by a combination of comb lens and slit lens is schematically shown in a perspective partial view of FIG. 2.

The combination comprises three lenses arranged at a distance from each other in z-direction, namely a slit electrode 43 having an aperture 45 elongated in x-direction, at the bottom; a slit electrode 47 disposed uppermost in z-direction which likewise comprises an aperture 49 elongated in x-direction; and a comb lens 51 disposed between the two slit electrodes 43 and 47. The comb lens 51 comprises two rows of finger electrodes 53 which are disposed on both sides of a central axis 55 of the comb lens 51 and extending in x-direction.

Electric potentials are supplied to the two slit electrodes 43 and 47 as well as to the finger electrodes 53 by a controller, not shown in FIG. 1, so that adjustable electric fields can be produced between the electrodes 43, 47 and 53. They act on a beam of charged particles which is oriented transversely to the xy-plane and passes through the apertures of the lenses 47, 51 and 45. When an electric potential is applied to the slit electrodes 43 or 47 which is different from the potential of the beam of charged particles in the plane of the slit electrodes 43, 47, the slit electrodes 43 and 47, respectively, have a same effect on the beam as a cylinder lens. An orientation of the electric field lines of a cylinder lens field as it is generated by such a slit electrode 43, 47 is schematically shown in FIG. 3a.

A pattern of electric potentials or voltages may be supplied to the finger electrodes 53 of the comb lens 51 such that an electric quadrupole field is generated in the aperture of the comb lens 51. A configuration of field lines of such quadrupole field is schematically shown in FIG. 3b, the field having an axis of symmetry 57 which extends in z-direction and intersects the longitudinal axis 55 of the comb lens 51.

A beam of electrically negatively charged particles entering this quadrupole field is focused in x-direction and defocused in y-direction.

Accordingly, when a beam enters the objective 19 along the axis of symmetry 57 of the quadrupole field, it is as a whole subjected to the effects of the cylinder lens fields provided by the slit electrodes 43 and 47 according to FIG. 3a and of the quadrupole field provided by the comb lens 51 according to FIG. 3b. The beam is thus subjected to a superposition of the field configurations shown in FIGS. 3a and 3b and, if the strengths of the cylinder lens fields and the quadrupole field are appropriately adjusted to each other, the same effect is provided on the beam as that provided by a round lens field symmetrically disposed in respect of the axis of symmetry 57, the field lines of such a field being schematically illustrated in FIG. 3c.

If appropriate voltages are applied to the electrodes 43, 47 and 53, it is thus possible to focus a beam of charged particles by means of the objective 19 in a similar way as it is effected with a round lens, wherein the optical axis 57 of the round lens is displaceable in x-direction.

It has been found that an imaging quality achievable with such an objective lens does not satisfy higher demands in particular in situations where object fields of a larger extension are simultaneously imaged.

SUMMARY OF THE INVENTION

Accordingly, it is an object of the present invention to provide particle-optical components and beam guiding arrangements, respectively, for displacing and shaping beams of charged particles.

It is a further object of the invention to provide a method for imaging a displaceable object field onto a stationary image field.

It is a further object of the invention to provide an electron microscopy system and a lithography system with improved optical properties, wherein an extended object field imaged on an image field is displaceable relative to the image field.

According to a first aspect, the invention starts from the finding that the effect of the cylinder lens according to FIG. 3a is provided on the beam at a location which is displaced in beam direction from a location where the effect of the quadrupole lens according to FIG. 3b is provided to the beam. This allows to only approximate the effect of a round lens. Due to the distance in beam direction between the cylinder lens effect and the quadrupole lens effect, quadrupole type effects will remain which may largely compensate each other in respect of their focal lengths, whose main planes, however, do not coincide in beam direction. Accordingly, a quadrupole type focusing effect must remain which cannot be compensated for by the configuration of quadrupole and cylinder lens fields.

Accordingly, the invention recognizes the finding that a round lens effect is never perfectly achievable by the system shown in FIG. 2 and that, much rather, quadrupole effects will remain to act on the beam traversing the configuration.

According to the invention, the aim of imitating a round lens effect as perfectly as possible by means of the configuration of the type shown in FIG. 2 is given up and a different approach is taken.

A quadrupole lens is provided in the portion of the non-displaceable beam cross-section, which is capable of at least partially compensating a quadrupole effect which is generated by a configuration of the type shown in FIG. 2 on a displaceable beam axis. It has been found that, if a beam guiding arrangement is configured according to this principle, imaging properties are achievable which, as a whole, are improved, while the structure of the system is still relatively simple.

Accordingly, in one aspect of the invention there is provided a beam guiding arrangement for deflecting a beam of charged particles, the arrangement comprising a first beam shaper which is traversed by the beam along a first beam axis, a second beam shaper which is traversed by the beam along a second beam axis and at least one beam deflector provided between the first and second beam shapers for displacing the first beam axis within the first beam shaper in a first direction. The first beam shaper provides a beam shaping field acting on the beam and providing a field component with quadrupole symmetry with respect to the first beam axis. Here, the focusing effect of the first beam shaper on the beam in a second direction is different from a focusing effect of the first beam shaper on the beam in a third direction oriented orthogonally to the second direction. The focusing effect may differ, for example, with respect to a focal length or a position of the main plane of the focusing effect.

According to this aspect of the invention the second beam shaper provides a beam shaping field acting on the beam which likewise comprises a field component with quadrupole symmetry, wherein the focusing effects of this beam shaping field are different from each other in the second and third directions. The focusing effects of the second beam shaper can be adjusted such that they at least partially compensate for the differences in the focusing effects of the first beam shaper.

In the electron microscopy system described above with reference to FIG. 1, the microscopy optics guides the primary electron beam towards the object plane as well as the secondary electron beam away from the object plane towards the detector. The field illuminated by the primary electron beam and the field imaged by the secondary electron beam are displaceable in the object plane. This puts high demands on the microscopy optics. Here, the demands put on the effect which the microscopy optics has on the secondary electron beam in respect of a position-true imaging of the object plane on the detector may be higher than the demands put on the effect provided on the primary electron beam. However, it must be taken into consideration that components of the microscopy optics which provide electrostatic fields have different effects on the primary electron beam and the secondary electron beam, since they often have different kinetic energies. Components of the microscopy optics which provide magnetic fields to act on the beams have likewise different effects on the primary and secondary beams, since the Lorentz force generated by the magnetic field acts opposite in sign on the electrons of the primary electron beam and secondary electron beam, respectively, due to the opposite directions of movement.

It is thus difficult to provide a substantially common beam path for the primary electron beam and the secondary electron beam, since an optical effect provided by conventional particle-optical components, for example, on the primary electron beam also has an optical effect on the secondary electron beam. The optical effects provided on the primary electron beam and on the secondary electron beam are thus closely coupled with each other in that portion of the optics which is commonly traversed by both beams. The design of microscopy optics for primary and secondary electron beams is not an easy task, accordingly.

According to a second aspect, it is an object of the present invention to provide a beam guiding arrangement for guiding two beams of charged particles of opposite beam direction, and allowing to decouple to a certain degree optical effects provided on the two beams.

To this end, the invention provides a beam guiding arrangement having at least one particle optical lens, wherein electric and magnetic fields extending orthogonally to each other are provided, each having a multipole symmetry of an order higher or equal two. The fields thus have a quadrupole symmetry, a hexapole symmetry or a higher symmetry. Such type of lens provides a degree of freedom to provide desired optical effects on the two beams passing through the lens in different directions. These optical effects may, in particular, comprise identical optical effects provided on the beams, or the optical effects may be adjusted such that merely one of the two beams is subjected to an optical effect and that substantially no optical effect is provided on the other beam.

In order to achieve this requirement with a particle-optical component, a mechanical configuration is preferred which provides an inside diameter or a bore diameter or a radial distance between facing pole shoes or electrodes for the beams to pass therethrough which is larger than three times the diameter of the two beams traversing the lens. Preferably, the diameter is larger than four times, further preferred, five times, more preferred, six times and, even further preferred, eight times the beam diameter. It is then possible that the two beams are subjected to a "proper" lens effect, that is, most of the electron trajectories distributed over the cross-section of a beam are also subjected to a deflection which corresponds to the desired lens effect dependent upon a distance of the trajectory under observation from the axis of symmetry of the lens. A relatively small number of electrons is then influenced by the fields provided by the lens such that they are "scattered out" of the beam by the fields and do, after a flight path of more than about 5 cm or 10 cm, no longer behave in an optically defined manner together with the other electrons of the beam. Such electrons are, in particular, not capable of transmitting a position-dependent image information.

As described above, as far as the optical properties of the electron optics are concerned, in an electron microscopy system described with reference to FIG. 1, the demands put on the beam path of the primary electron beam can be less than the demands put on the beam path of the secondary electrons. However, it has been found that, when the beam path of the secondary electron beam is designed for a large extension of the imaged object field, it is no longer easily possible to provide a fairly homogeneous illumination of the object field with the primary electron beam. The inventors have found a reason for that to reside in that, among others, the kinetic energies of the primary electrons and the secondary electrons are different from each other when passing through the imaging optics. Thus, the particle-optical components in the optics have a different effect on the primary electron beam and the secondary electron beam. In particular, the primary electron beam for illuminating a larger extended object field must likewise be "threaded" through the optics with a larger diameter. This larger diameter of the primary electron beam within the imaging optics results into such beam guiding errors that the primary electron beam can no longer be correctly guided within the optics.

In one aspect of the invention it is applicable to "thread" the primary electron beam with a relatively small diameter through a major part of the imaging optics and to subject the primary electron beam to a "beam expansion" relatively shortly in front of the object plane.

To this end, the expansion of the primary electron beam must be effected by a particle-optical component which does not have a corresponding effect on the secondary electron beam traversing said component in opposite direction, which would cause a reduction of the cross-section of the secondary electron beam interfering with the imaging properties for the secondary electron beam.

To this end, the invention provides a particle-optical component which makes use of the circumstance that the primary electron beam and the secondary electron beam traverse this component in opposite direction. Such particle-optical component provides a field region in which a magnetic field and an electric field are superimposed orthogonally relative to each other, the electrical field and the magnetic field having a multipole symmetry, but no dipole symmetry. The multipoles can thus comprise quadrupole, hexapole, octopole etc. In this respect, it is possible that the field strengths of the magnetic field and the electric field are adjusted to each other such that the particle-optical component has substantially no effect on the secondary electron beam so that the charged particles thereof are substantially not deflected. With such particle-optical component it is thus possible to provide a desired influence on the primary electron beam and, in particular, to expand the same shortly in front of the object plane, while substantially not influencing the imaging properties of the optical system for the secondary electron beam.

The invention also provides that the primary electron beam is astigmatically deformed relatively shortly in front of the object plane such that it is focused in a first plane and defocused in a second plane extending orthogonally to the first plane and such that the focusing in the first plane is so strong that an astigmatic cross-over, in particular, a line focus is generated in front of the object plane.

BRIEF DESCRIPTION OF THE DRAWINGS

The forgoing as well as other advantageous features of the invention will be more apparent from the following detailed description of exemplary embodiments of the invention with reference to the accompanying drawings, wherein:

FIGS. 4-1 and 4-2 illustrate a perspective schematic view of an electron microscopy system according to an embodiment of the invention, FIG. 4-2 being a continuation of the right-hand side of FIG. 4-1;

DETAILED DESCRIPTION OF EXEMPLARY EMBODIMENTS

Figure 1:
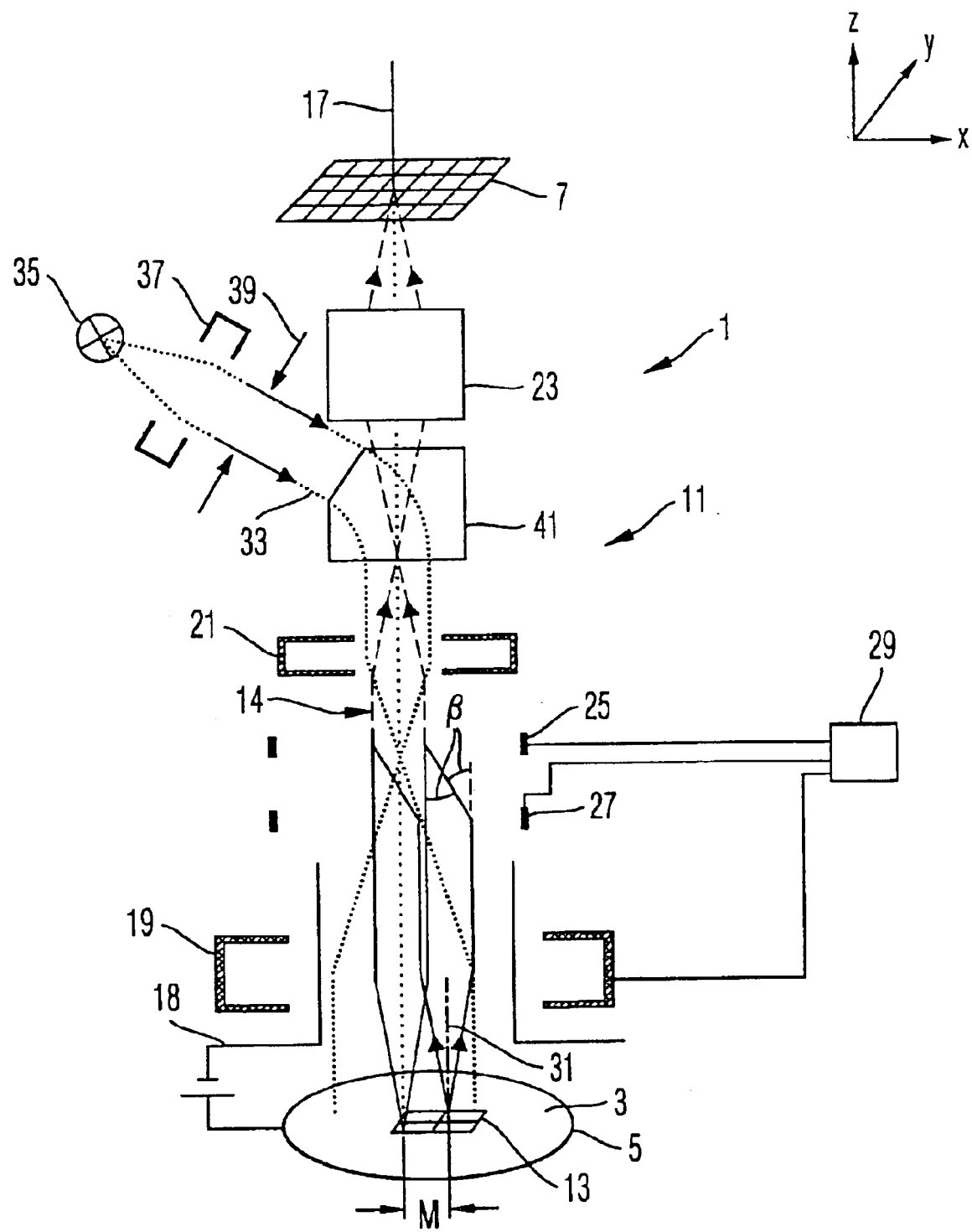
FIG. 1 shows a configuration of a conventional electron microscope.
Figure 2:
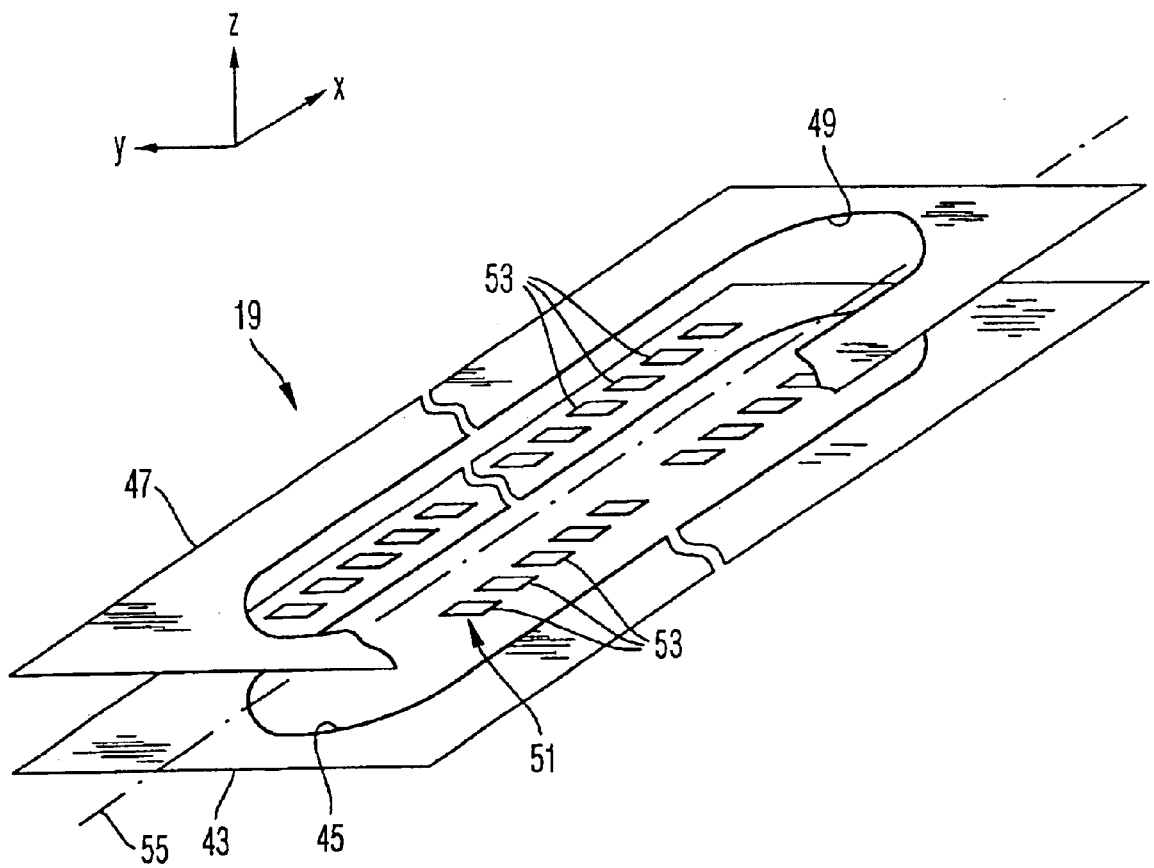
FIG. 2 is a perspective broken-away representation of an objective lens of the electron microscope shown in FIG. 1.
Figures 3A, 3B, 3C:
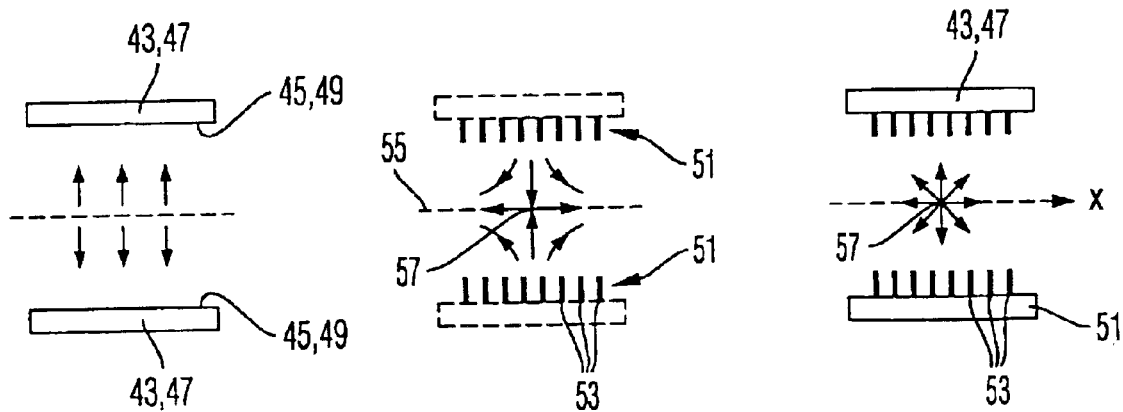
FIGS. 3a–3c show field lines for illustrating the objective lens according to FIG. 2.
Figures 1, 4:
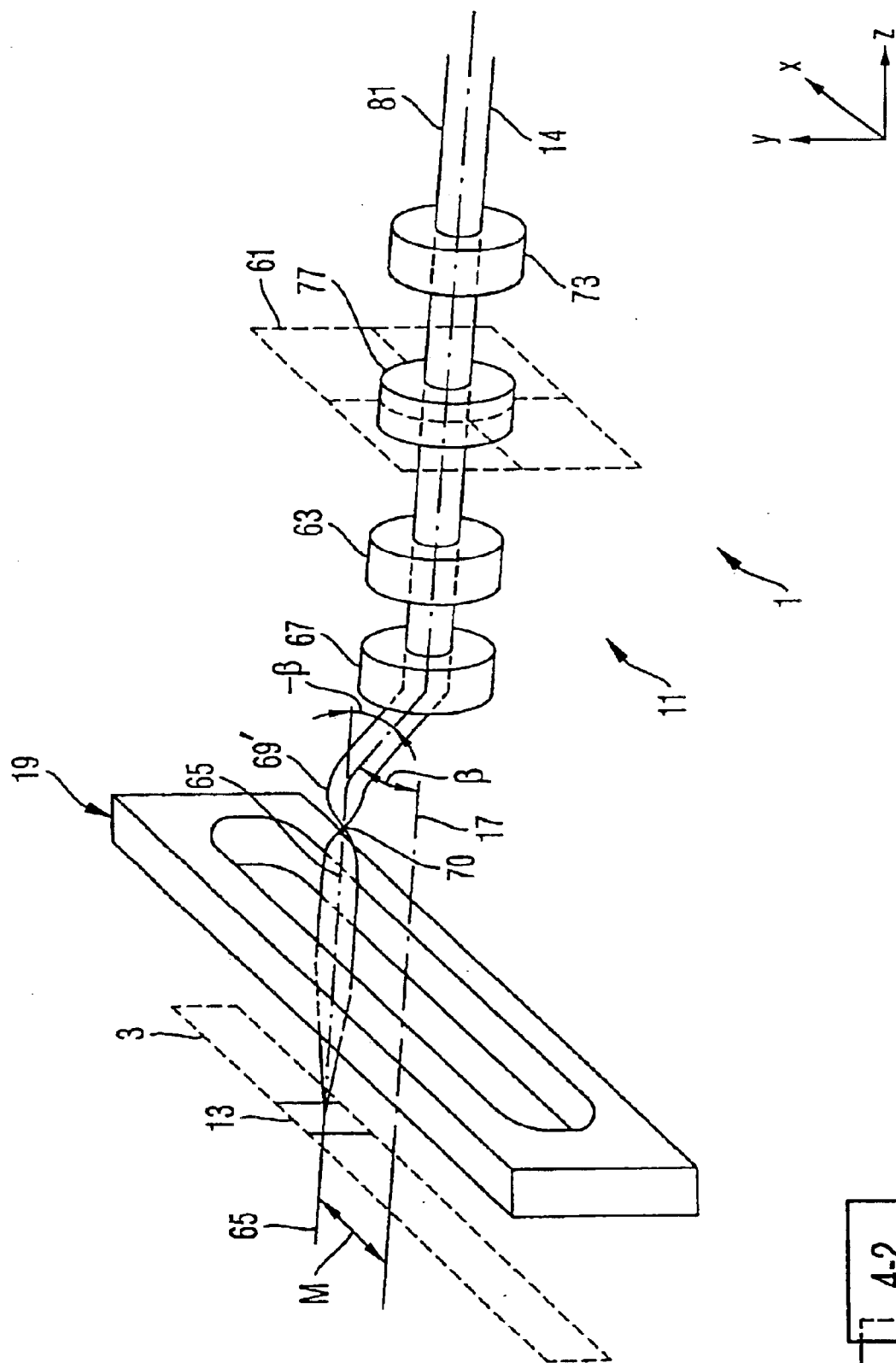
Figures 2, 4:
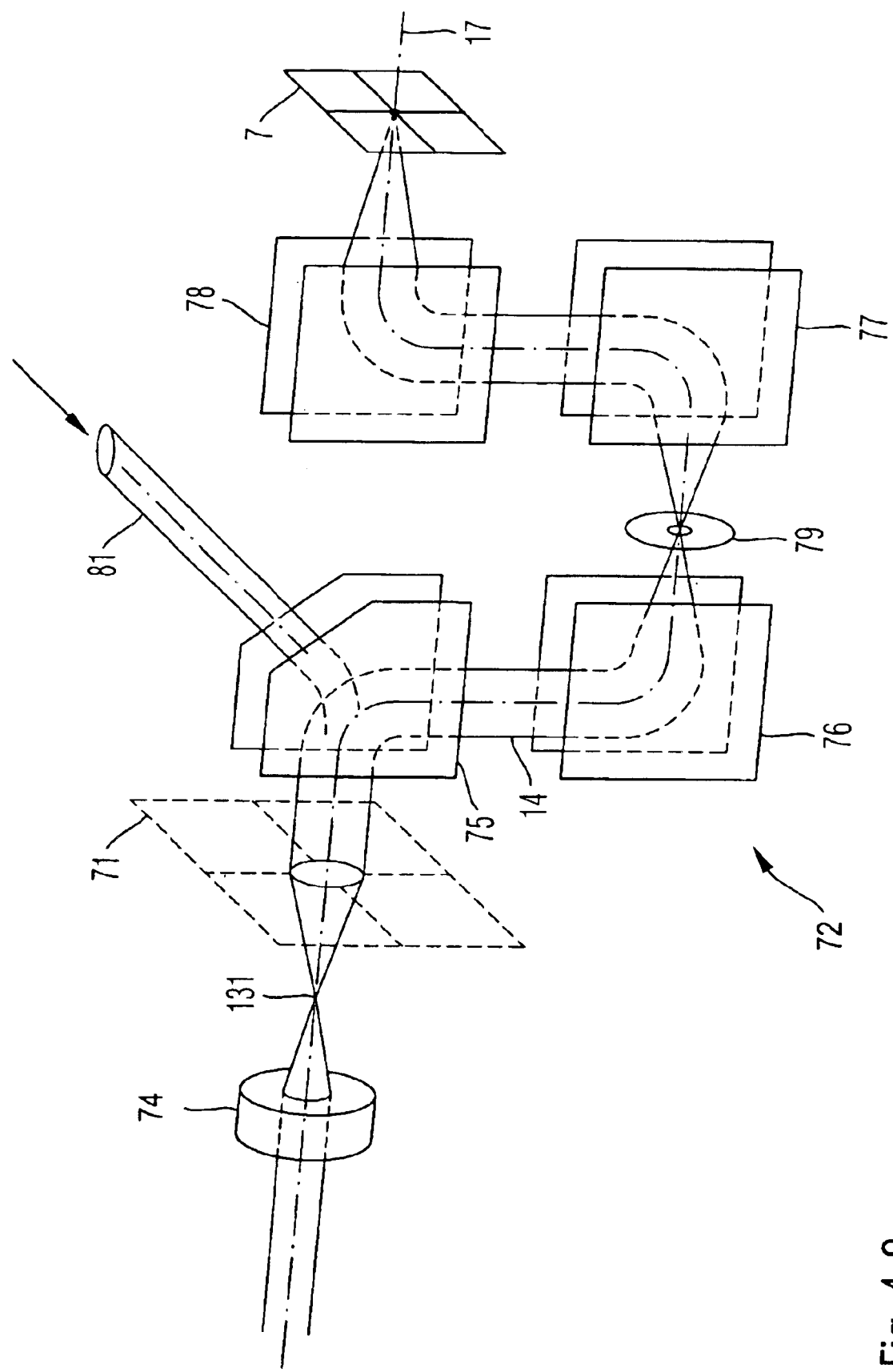

An exemplary electron microscopy system 1 according to an embodiment of the invention which is perspectively and schematically shown in FIGS. 4-1 and 4-2 is used to image an object plane 3 onto a position-sensitive detector 7. To this end, an object field 13 of the object plane 3 is imaged on the detector 7 at a point in time. The imaged object field 13 is displaceable by an adjustable amount M with respect to a main optical axis 17 of the microscopy system 1. Secondary electrons emanating from the object field 13 are shaped to form a secondary electron beam 14 and threaded through a microscopy optics 11 and supplied to the detector 7.

For imaging the object plane 3 in an intermediate image plane 61, the microscopy optics 11 comprises a first beam shaper 19, referred to hereinafter as objective lens, and a second beam shaper 63 disposed in the direction of the secondary electron beam downstream from the objective 19. These components will be described hereinbelow in more detail.

The secondary electron beam 14 passes through the beam shaper 63 with a fixed position of its cross-section on the optical axis 17.

Figure 6:
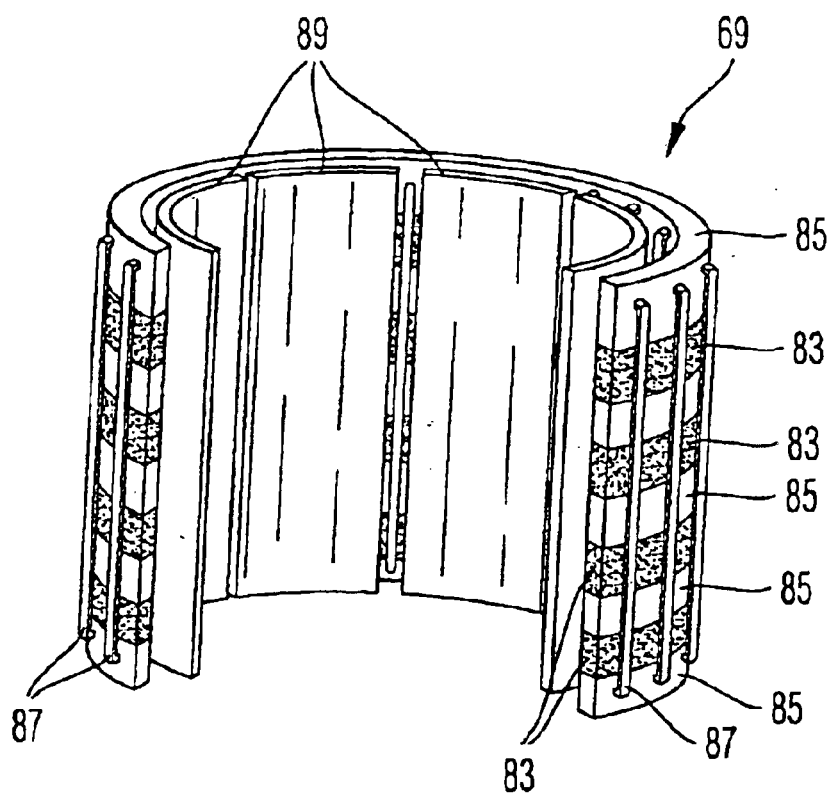
FIG. 6 is a perspective cut-open representation of a beam deflector used in the microscopy system according to FIGS. 4-1 and 4-2.
Figure 7:
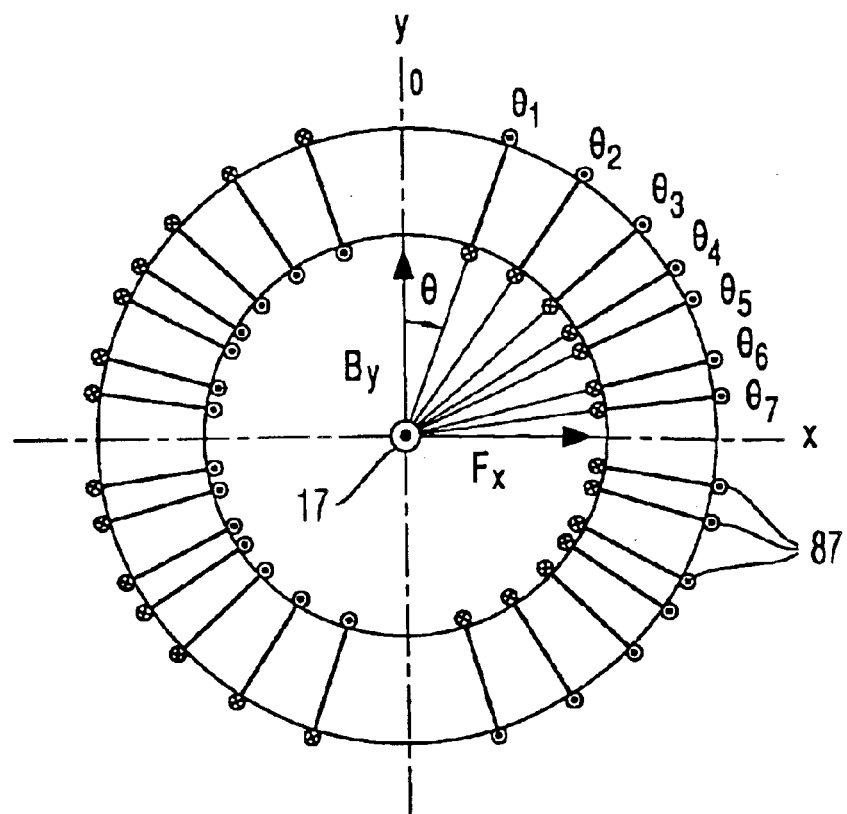
FIG. 7 is a plan view of a portion of the beam deflector according to FIG. 6.

However, the secondary beam 14 passes through the objective lens 19 along a beam axis 65 which extends parallel to the main optical axis 17 and is displaced by an amount M from the main axis. For generating such displacement, two beam deflectors 67 and 69 are disposed between the objective lens 19 and the second beam shaper 63. Only the beam deflector 67 which is disposed closer to the second beam shaper 63 is shown in FIG. 4-1, and the beam deflector 69 (such as illustrated in FIGS. 6 and 7, for example) which is disposed closer to the objective lens 19 is not shown in FIG. 4-1 for the purpose of clarity. This second beam deflector 69, not shown in FIG. 4-1, causes the secondary electron beam 14 to be deflected by an angle −β at a position of the beam which is designated by reference numeral 69' in FIG. 4-1. The beam deflector 67 causes the secondary electron beam to be deflected by a deflection angle β which is adjusted such that the secondary electron beam is parallelly displaced by the amount M by the two deflectors 67, 69.

Between the objective lens 19 and the deflector 69 at position 69', there is further provided a cross-over 70 in the secondary electron beam.

The electron microscopy optics 11 images the intermediate plane 61 into a further intermediate image plane 71 by means of the secondary electron beam, to which end a transfer lens doublet of two round lenses 73 and 74 centered on the main axis 17 are disposed between the intermediate image planes 61 and 71. Furthermore, an additional round lens 77 which is likewise centered on the main axis 71 is provided near the intermediate image 61.

Between the intermediate image plane 71 and the detector 7, there is disposed an image-preserving energy filter 73 which allows electrons of the secondary electron beam 14 with an adjustable predetermined kinetic energy to pass to the detector 7, wherein the position information contained in the beam is preserved so that an image of the intermediate plane 71 and thus of the object field 13 is generated on the detector 7.

Such an image-preserving energy filter 72 is known, among others, from U.S. Pat. No. 4,740,704 and comprises four sector magnets 75, 76, 77 and 78 which the secondary electron beam 14 successively traverses. Each of the sector magnets 75 to 78 deflects the beam by an angle of about 90° and acts as a lens such that a beam cross-over is formed in a plane between the sector magnets 76 and 77. In this plane, there is disposed an aperture stop 79 which performs the energy selection. Only electrons with a kinetic energy within a predetermined energy range are allowed to pass through the aperture stop 79.

A primary electron beam 81 which is generated and collimated by an electron source, not shown in FIG. 4-2, travels towards the sector magnet 75 at an angle of about 135° with respect to the secondary electron beam 14 and is deflected by the sector magnet 75 by about 45° such that the primary electron beam 81, after having been deflected in the sector magnet 75, is superposed on the beam path of the secondary electron beam 14 and travels on the main axis 17 towards the object plane 3. Accordingly, the sector magnet 75 of the energy filter 72 acts as beam splitter in order for the beam paths of the primary electron beam 81 and the secondary electron beam 14 to be superimposed and separated from each other, respectively.

The microscopy optics 11 provides a common beam path for the primary electron beam 81 and the secondary electron beam 14 between the beam splitter or sector magnet 75 and the object field 13, that is, cross-sections of the primary electron beam 81 and the secondary electron beam 14 overlap each other at least partially or are at least laterally displaced not very far from each other, although the electrons of the primary electron beam 81 and the secondary electron beam 14 may have different kinetic energies. For example, the kinetic energy of the electrons of the primary electron beam 81 is about 22 keV and that of the secondary electron beam 14 is about 20 keV.

The beam deflectors 67 and 69 provide equal deflection angles $-\beta$ and $\beta$, respectively, both for the primary electron beam 81 and the secondary electron beam 14. To this end, the deflector 67 can be configured as it is illustrated in FIGS. 6 and 7 in respect of the deflector 69. The deflector 69 is configured as described hereinbelow with reference to FIG. 12.

The deflector 67 comprises plural rings 83 of ferrite material of a high magnetic permeability disposed concentrically along the main axis 17 and plural rings 85 of a ceramic material of a low magnetic permeability which are disposed between the ferrite rings 83 as well as at the ends of the thus formed stack of rings 83, 85. The ceramic rings 85 disposed at the ends of the stack are traversed by a plurality of current conductor windings 87 which engage around the ferrite rings 83. A distribution of the current conductor windings 87 in circumferential direction about the main axis 17 is evident from FIG. 7. The angles $\theta_1$ to $\theta_7$ encountered therein have the following values: $\theta_1=21.6°$, $\theta_2=41.6°$, $\theta_3=47.6°$, $\theta_4=62.4°$, $\theta_5=68.4°$, $\theta_6=78.5°$ and $\theta_7=84.5°$. These angles are selected such that the magnetic field generated by the current conductor windings 47 is a substantially homogeneous magnetic field oriented in y-direction.

Eight electrodes 89 are disposed radially inside the rings 83, 85 and uniformly distributed in circumferential direction. Voltages can be applied to the electrodes such that a substantially homogenous electric field oriented in x-direction can be provided in a region about the main axis 17.

The deflection angels $\beta$ and $-\beta$ for the electrons of the primary electron beam and the secondary electron beam, respectively, are equal when the electric field strength and the magnetic field strength approximately fulfill the following relation:

$$B(E_x) = \frac{V_{z1} - V_{z2}}{V_{z1} \cdot V_{z2}} \cdot E_x,$$

wherein $V_{z1}$ is the velocity of the primary electrons and $V_{z2}$ is the velocity of the secondary electrons.

If this equation is fulfilled when selecting the electric and magnetic fields strengths, it is possible for the primary electrons and the secondary electrons to be deflected by the deflector 69 at the same opposite angles so that the trajectories thereof coincide.

Figure 5:
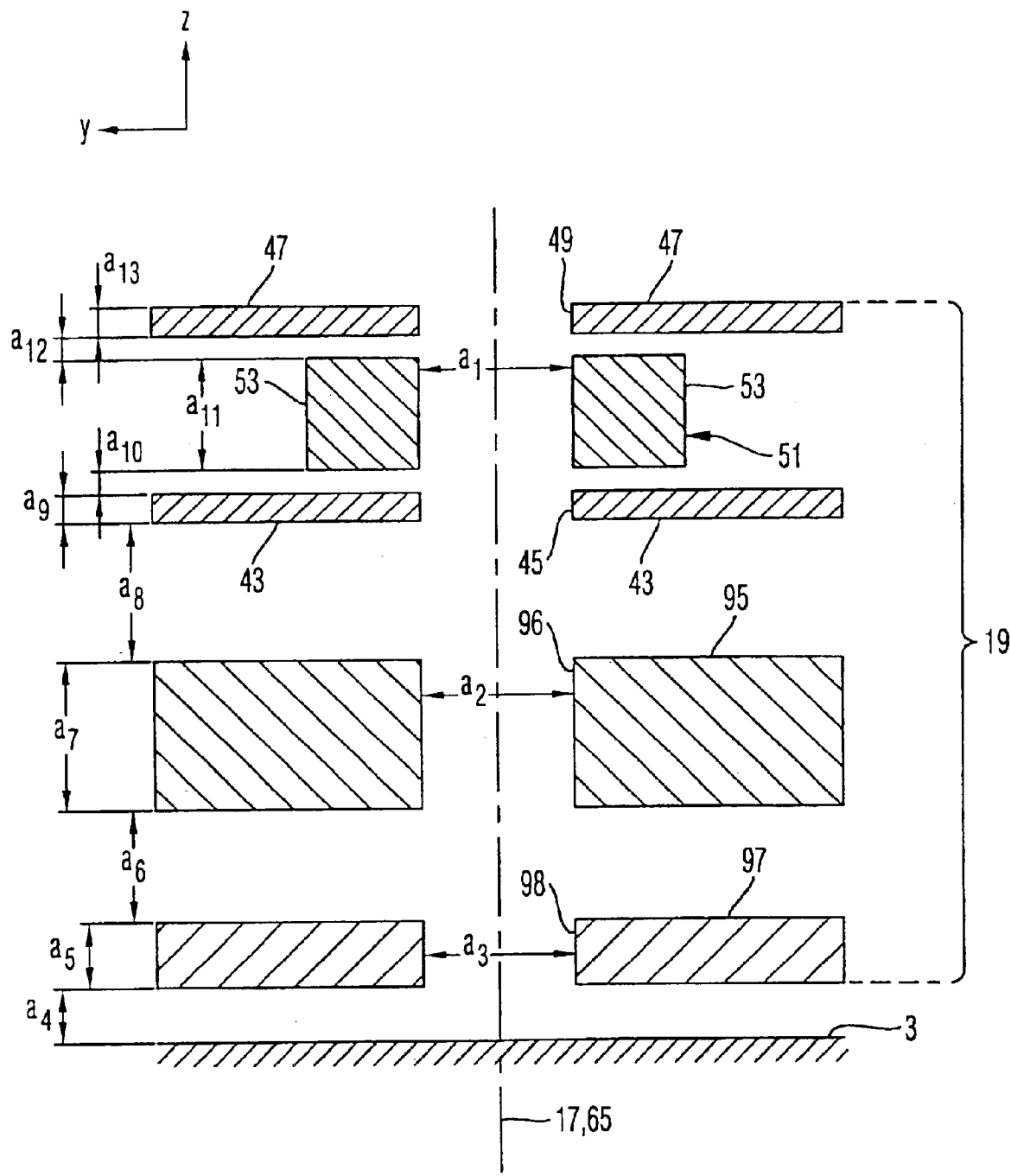
FIG. 5 shows a cross-section through an objective lens of the electron microscopy system of FIGS. 4-1 and 4-2.

The objective lens 19 is configured as shown in FIG. 5 in a cross-section oriented in the yz-plane. The objective lens comprises two slit lenses 43 and 47 as well as a comb lens 51 disposed therebetween with two rows of finger electrodes 53. The spatial configuration of the electrodes 43, 47 and 53 corresponds to that perspectively shown in FIG. 2.

The slit lens 47 has a slit opening 49 with an inside diameter $a_1$, in y-direction of 5 mm. Similarly, the slit lens 43 has an opening 45 with an identical inside diameter $a_1$ of 5 mm. Finger electrodes 53 which are likewise disposed opposite to each other are spaced apart from each other at a distance of $a_1=5$ mm. Seen in z-direction, the slit lens 43 have a thickness $a_9=1$ mm. A distance $a_{10}$ between the slit lens 43 and an edge of the finger electrodes 53 is 1 mm. A dimension $a_{11}$ of the finger electrodes 53 in z-direction is 6 mm, a distance $a_{12}$ between the finger electrodes 53 and the slit lens 47 is 1 mm, and a thickness $a_{13}$ of the slit lens 47 is likewise 1 mm.

Between the slit lens 43 and the object plane 3, there is disposed a further slit lens 95 with a slit opening 96 which has an inside diameter $a_2$ in y-direction of 5.5 mm. The slit lens 95 is spaced apart from the slit lens 43 at a distance $a_8$ of 5.475 mm and has itself a thickness $a_7$ of 6.75 mm. Between the slit lens 95 and the object plane 3, there is provided a further slit lens 97 with a slit opening 98 which has an inside diameter $a_3$ of 4.5 mm. The slit lens 97 is spaced apart from the slit lens 95 at a distance $a_6$ of 6.525 mm and at a distance $a_4$ of 1.75 mm from the object plane 3 and has itself a thickness $a_5$ of 2.5 mm.

When the object 3 is at earth potential, a voltage of 4.1 kV is applied to the slit lens 97, a voltage of 47.2 kV to the slit lens 95, a voltage of 14.8 kV to the slit lens 43 and a voltage of 14.8 kV to the slit lens 47. The finger electrodes 53 are controlled to provide a quadrupole field positioned on the deflected beam axis 65.

The electrodes 47, 53, 43, 95 and 97 of the objective lens 19 cooperate in acting on the primary and secondary electron beams 81, 14 passing through the objective lens 19. As far as functional effects of these electrodes on the secondary electron beam are separable at all, the following functions may be attributed to these electrodes in order to obtain a better understanding of the function of the objective lens: the electrode 97 acts as extraction electrode in order to provide an electric field between the electrode 97 and the object positioned object plane 3 which accelerates the secondary electrons and decelerates the primary electrons before impinging on the object; the electrode 95 has a focusing function; the finger electrodes 53 provide a quadrupole field focusing in x-direction and the electrodes 43 and 47 shield the quadrupole field in z-direction.

Figure 8:
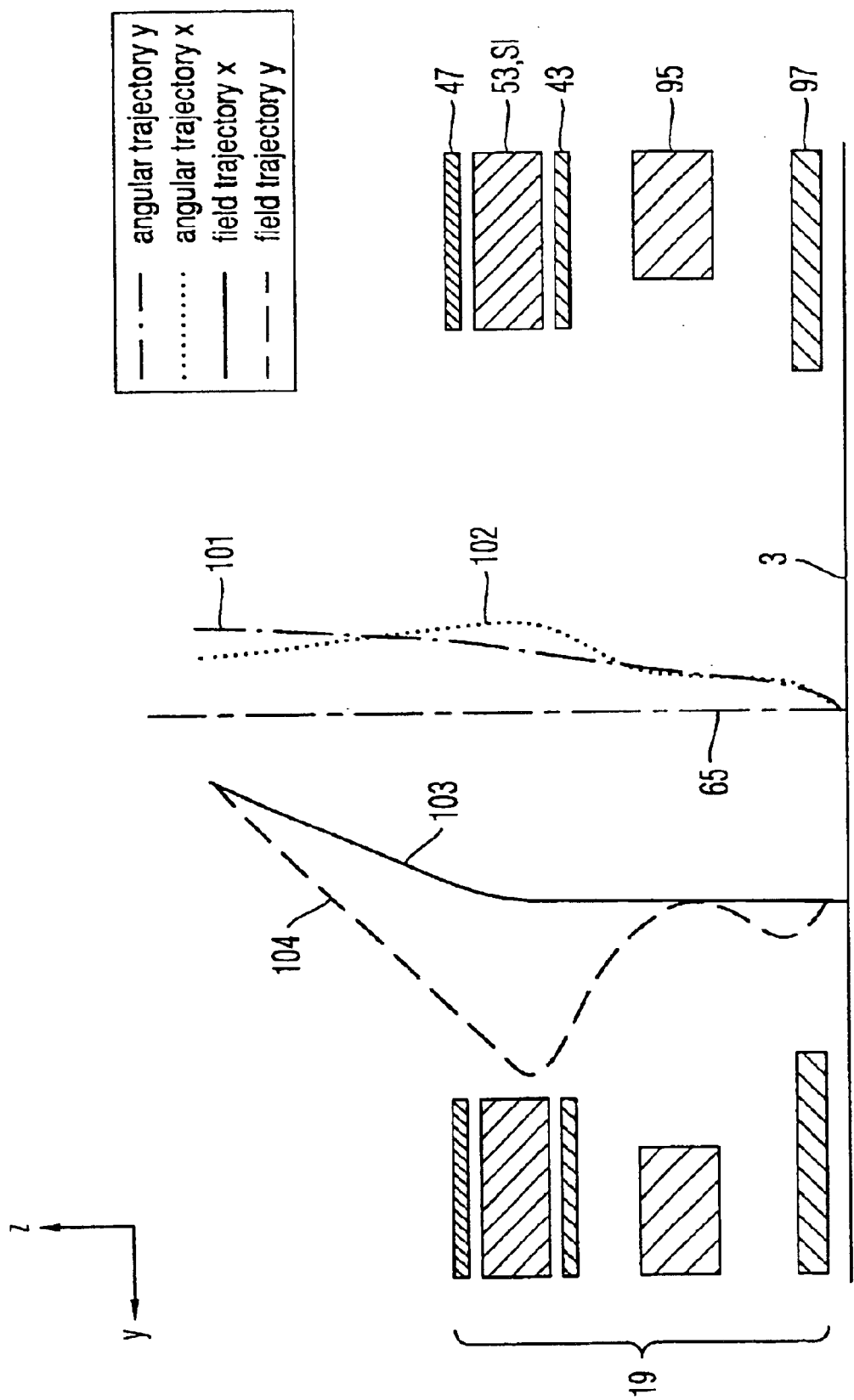
FIG. 8 shows trajectories through the objective lens shown in FIG. 5.

FIG. 8 schematically shows trajectories or beam rays of secondary electrons traversing the objective lens 19.

In this figure, a dash-dot line 101 is representative of the deflection in x-direction of a secondary electron which starts from object plane 3 on the axis 65 at an angle in x-direction; a dotted line 102 is representative of the deflection in y-direction of an electron which starts on the axis 65 from the object plane 3 at an angle in y-direction; a full line 103 is representative of the deflection in x-direction of an electron which starts from the object plane 3 at a distance from the axis 65 and parallel thereto; a dashed line 104 is representative of the deflection in y-direction of an electron which starts from the object plane 3 at a distance from the axis 65 and parallel thereto.

It is evident from the trajectories 101 to 104 in FIG. 8 that the objective lens 19 has different effects on the secondary electrons in the xz-plane and the yz-plane which, as a whole, can be considered as astigmatic effect of the objective lens 15. Such astigmatic effect is on principle not advantageous for an electron microscopy optics. However, the objective lens 19 has the property that this astigmatic effect is displaceable substantially arbitrarily in x-direction (namely ±15 mm in the described embodiment) by changing the excitation of the finger electrode 53 in x-direction.

Figure 9:
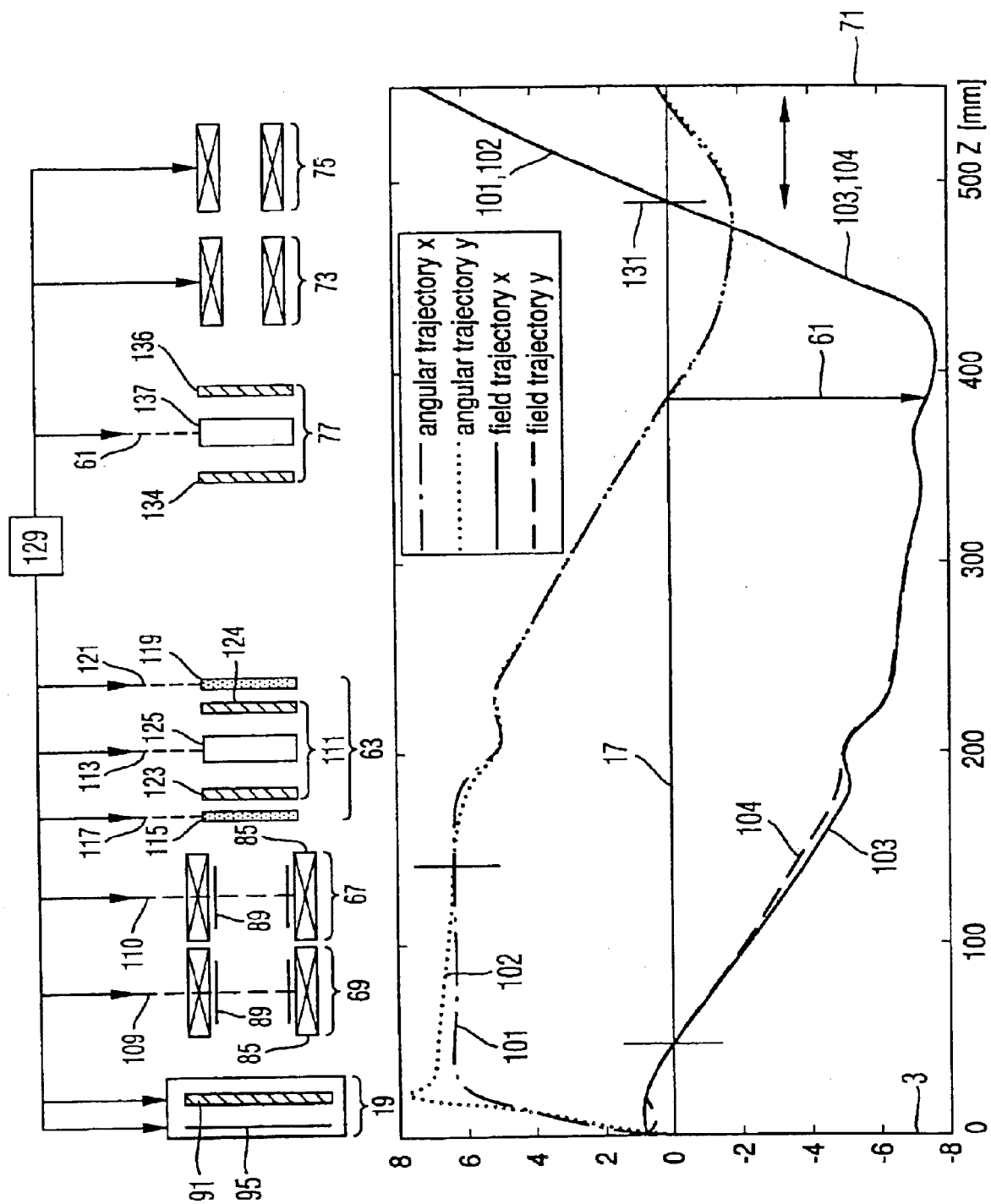
FIG. 9 shows trajectories of an imaging beam path through the electron microscopy system shown in FIG. 3.

The astigmatic effect tolerated in the objective lens 19, that is, an effect different from that of a round lens, is compensated for in the subsequent beam path of the secondary electron beam 14 by the beam shaper 63, as it is apparent from FIG. 9. This figure shows in the lower part the beam path of the microscopy optics 11 between the object plane 3 at z=0 mm and the second intermediate image plane 71 at z=580 mm. The trajectories 101, 102, 103 and 104 shown enlarged in size in FIG. 8 are continued in FIG. 9. Above the representations of the trajectories 101 to 104, electron-optical components of the optics 11 are symbolically represented, including the objective lens 19 already illustrated above in detail and the two beam deflectors 69 and 67 with windings 85 and electrodes 89, wherein a center plane 109 of the beam deflector 69 is disposed at z=50 mm and a mid-plane 110 of the beam deflector 67 is disposed at z=150 mm.

The beam shaper 63 is configured symmetrically in respect of a center plane 113 at z=210 mm and comprises a quadrupole lens 115 having a center plane 117 at z=190 mm and a further quadrupole lens 119 having a center plane 121 at z=230 mm. Between the two quadrupole lenses 115 and 119, there is disposed an electrostatic round lens 111 which comprises two aperture electrodes 123 and 124 and a focusing electrode 125 disposed therebetween.

It is a purpose of the beam shaper 63 to recombine the trajectories 101/102 and 103/104 of the secondary electron beam 14 which are separated from each other after traversing objective lens 19, such that a first intermediate image 61 of adequate quality is obtained. The intermediate image 61 is generated in the embodiment described with reference to FIG. 9 at z=385.

The combination of the trajectories 101/102 and 103/104, respectively, is effected by the two quadrupole lenses 115 and 119 which are spaced apart from each other in z-direction and by the round lens 111 such that the beams 101 and 102 both intersect the axis 17 in the intermediate image plane 61 so that a substantially sharp image of the object plane 3 is obtained in the plane of the intermediate image 61. Moreover, the slope with respect to the axis 17 of both trajectories 101 and 102 is substantially identical in the intermediate image plane 61 so that the imaging from the object plane 3 into the intermediate image plane 61 is effected with substantially the same magnifications in x-direction and y-direction.

Moreover, the imaging of the object plane 3 into the intermediate image plane 61 is characterized by a further feature which is not directly apparent from FIG. 9: two trajectories starting from the object plane 3 on the axis 65 at a same angle relative to the axis and having different kinetic energies intersect the axis 17 again at a common position which is in the intermediate plane 61, so that the image is substantially free of a spatial dispersion. Spatial dispersion results from an integral over the product of dipole strength times path height for the angular ray x along the axes 65 and 17, respectively. Some angular dispersion in the imaging is, however, tolerated in the illustrated embodiment.

If the axis 65 is displaced from the main axis 17 at M=0.0 mm, the secondary electrons must travel a distance of 580 mm from the non-displaced object field 13 to the intermediate image plane 61. This distance increases with increasing displacement M, since the secondary electrons travel under an angle towards the main axis 17 in a region between the two deflectors 69 and 67. Moreover, the beams will pass through the deflectors 69 and 67 not exactly along the optical axis so that, as a result, an astigmatism error is produced. It is thus evident that the properties of the intermediate image 61 which is fixedly positioned at z=385 mm likewise slightly change with a displacement M of the object field 13 in x-direction. However, these changes can be dynamically corrected. To this end, five degrees of freedom are necessary:

two degrees of freedom (1) and (2) to maintain the point of intersection of the angular trajectories 101 and 102 (x and y) with the axis 17 at a same position, two degrees of freedom (3) and (4) for maintaining the slopes of the angular trajectories 101 and 102 with respect to the axis 17 (x and y) at a same value, one degree of freedom (5) for maintaining a spatial dispersion of substantially zero.

Accordingly, in order to adjust these degrees of freedom in dependence of displacement M, five freely adjustable parameters of the optics 11 are necessary and given by:

(i) the change of the voltage applied to lens 95 focusing in y-direction of the objective lens and, if applicable, to other lenses of the objective lens, (ii) the strength of the quadrupole field of the comb stop 51 focusing in x-direction by changing the voltage pattern applied to the finger electrodes 53, (iii) the strength of the focusing effect of the electrostatic round lens 111 by changing the voltage applied to the focusing aperture 125, (iv) changing the strength of the quadrupole lens 115, and (v) changing the strength of the quadrupole lens 119.

To this end, the microscopy optics 11 comprises a controller 129 for adjusting the excitation of the deflectors 69 and 67 in order to adjust the desired displacement M. With the focusing aperture 95, the comb lens 51, the quadrupole lens 115, the round lens 111 and the further quadrupole lens 119, the controller 129 then further controls the above-described five parameters (i) . . . (v) such that, with the above-described five degrees of freedom (1) . . . (5) of the optics, the intermediate image 61 is substantially stable independent of the displacement M. However, there are two further properties which are still dependent on the displacement M downstream of the intermediate image 61 in the beam path, namely (6) the position of a cross-over 131, that is, a point of intersection of the beams 103 and 104 with the axis 17, between the two intermediate images 61 and 71 can be displaced along the axis 17, resulting in a change of the distance of the cross-over 131 from the second image plane 17. However, this distance is an important parameter for the optics following further downstream. This parameter is the so-called Helmholtz length for the energy filter 72. As a result, when the position of the cross-over 131 changes, the function of the energy filter 72 changes as well, which is undesired. This corresponds also to a change in the slope of the field trajectories 103 and 104.

In order to dynamically adjust the degree of freedom (6), the electrostatic focusing lens 77 disposed in the intermediate image plane 61 is controlled by the controller 129. The focusing lens 77 comprises two shield apertures 134 and 136, with a focusing electrode 137 being disposed therebetween. The potential of the focusing electrode 137 is changed by the controller 129. Since the focusing lens 77 is disposed near the intermediate image plane, a change in the power thereof mainly influences the field trajectories 103, 104. As a result, the degree of freedom (6) is effectively compensated for.

In order to increase an optical magnification in the second intermediate image and to adjust the Helmholtz length of the system to that of the energy filter, the two magnetic focusing lenses 73 and 75 are provided which are controlled by the controller 129 such that the location of the cross-over 131 is stably disposed at z=500 mm. The Helmholtz length of 60 mm is then constantly fulfilled for the energy filter 72.

The path of the primary electron beam 81 through the optics 11 will be described hereinbelow.

Figure 10A:
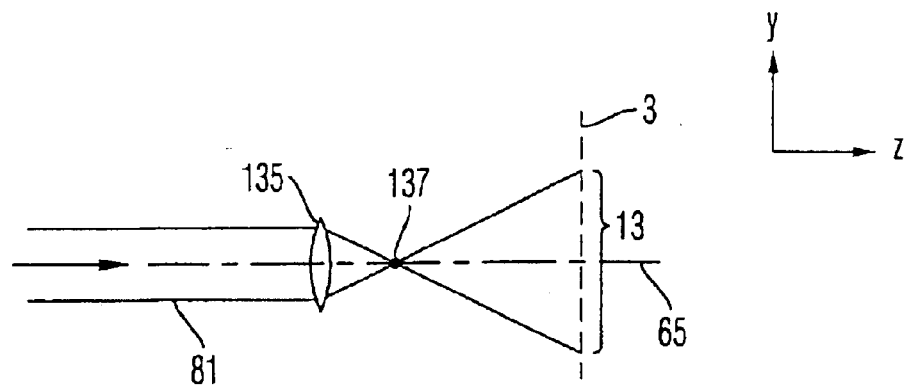
FIGS. 10a and 10b are an illustration of a component in an illumination beam path of the electron microscopy system shown in FIG. 3.
Figure 10B:
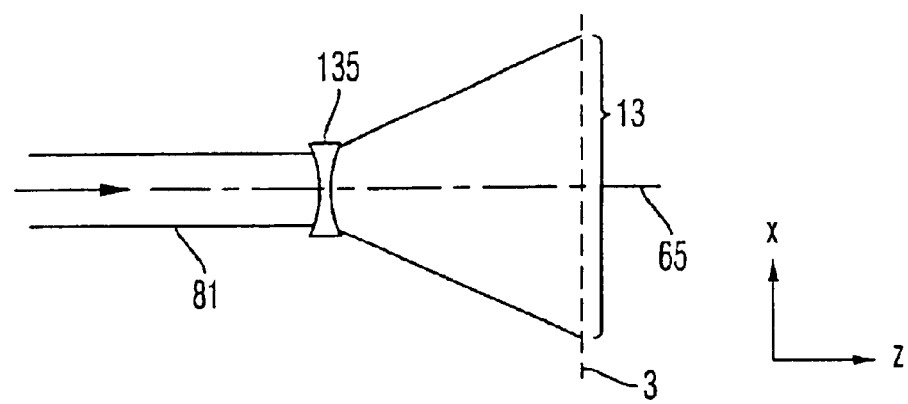

In addition to the other optical members, the effect of a quadrupole lens 135 is provided on the primary electron beam 81 in the plane 110 of the deflector 67, as it is schematically illustrated in FIGS. 10a and 10b. FIG. 10a shows a cross-section in the yz-plane and FIG. 10b a cross-section in the xz-plane along the axis 65. The quadrupole lens 135 is disposed at a distance from the object plane 3 and has a focusing effect on the primary electron beam 81 in the yz-plane to such a degree that a line focus 137 is generated between the quadrupole lens 135 and the object plane 3. After having passed through the line focus 137, the primary electron beam 81 impinges on the object plane 3 (FIG. 4-1). The quadrupole lens 135 thus causes a significant expansion of the illuminated field of the object plane 3 in y-direction.

In the xz-plane, the quadrupole lens 135 has a defocusing effect so that in x-direction as well the illuminated object field 113 is likewise significantly expanded by the quadrupole lens 135.

According to the principle described with reference to FIGS. 10a and 10b, it is possible to illuminate with a primary electron beam 81 of a relatively small diameter a relatively large object field 113. The quadrupole lens 135 is provided for the primary electron beam 81 in the plane 110 of the deflector 67. The quadrupole lens 135 has substantially no effect on the secondary electron beam 14. In particular, the quadrupole lens transmits the secondary electron beam completely, that is, the quadrupole lens itself does not absorb secondary electrons. Furthermore and independent thereof, no influence is exerted either by the quadrupole field on the electrons transmitted by the quadrupole lens 135 to the effect that the secondary electrons are deflected from their path by the quadrupole field effect to such a degree that they leave the subsequent beam path. Substantially all secondary electrons which pass through the quadrupole lens 135 impinge on the detector 7. However, further auxiliary detectors can be provided in the system at other locations. Nevertheless, in this case, more than 50%, in particular, more than 80% and, further preferred, more than 90% of all secondary electrons transmitted by the quadrupole lens impinge on the detector 7 which serves as main detector.

Figure 12:
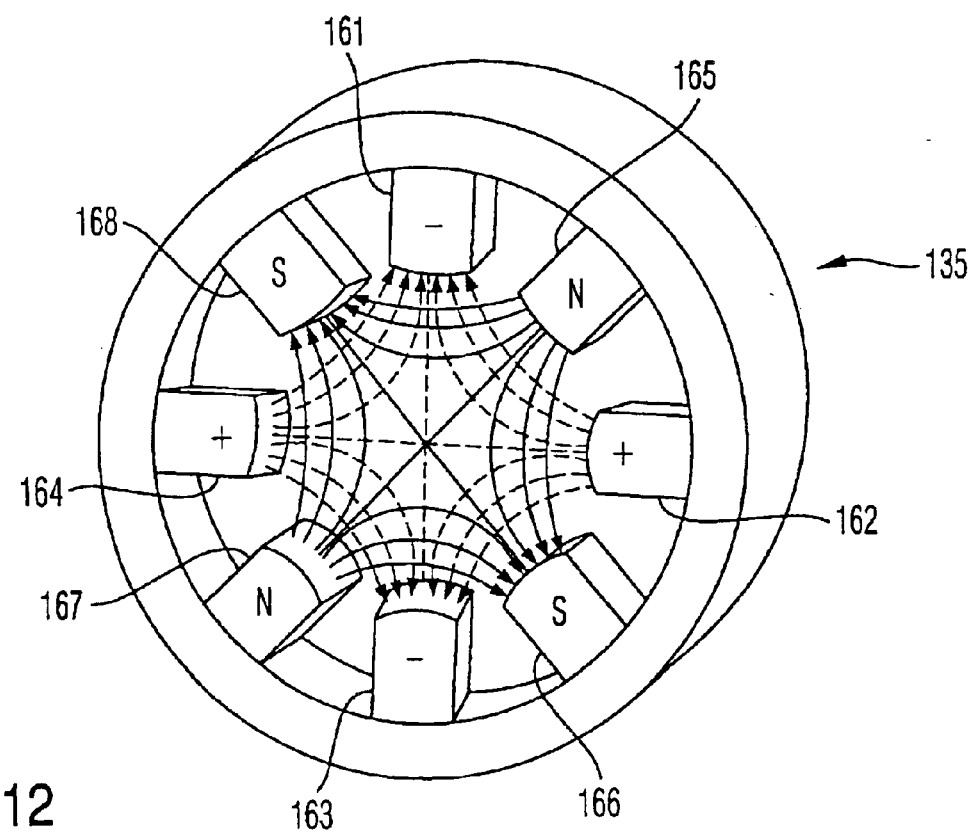
FIG. 12 is a perspective view of a quadrupole lens used in a microscopy system according to FIGS. 4-1 and 4-2.

To this end, the quadrupole lens 135 is configured as illustrated in further detail with reference to FIG. 12. The quadrupole lens 135 of this Figure comprises four electric field source members, i.e., electrodes 161, 162, 163 and 164, distributed circumferentially about the beam axis. The two electrodes 161 and 163 which are disposed opposite to each other in respect of the beam axis have a negative potential, and the electrodes 162 and 164 oriented transversely thereto and likewise disposed opposite to each other have positive potential. Field lines of the quadrupole field caused by the electrodes 161 to 164 are indicated in FIG. 12 by dashed lines. Four magnetic field source members or magnetic poles 165, 166, 167 and 168 are distributed in circumferential direction about the beam axis such that a magnetic pole 165 to 168 is respectively disposed circumferentially in-between two electrodes 161 to 164. The magnetic poles provide in the circumferential direction alternating magnetic north poles and magnetic south poles. Magnetic fields generated between the magnetic poles 165 to 168 are indicated in FIG. 12 by full lines.

Due to the illustrated geometry of electrodes and magnetic poles, the magnetic and electric field lines extend substantially normal to each other at each location in a region near the beam axis.

The strengths of the magnetic quadrupole field and the electric quadrupole field are adjusted relative to each other such that the secondary electron beam, when passing through the quadrupole lens 135, is subjected to substantially no quadrupole effect. To this end, the fields of the quadrupole components of the lens satisfy the following formula:

$$\vec{E} = -\vec{v} \times \vec{B}$$

wherein $\vec{E}$ is the electric field, $\vec{B}$ is the magnetic field and $\vec{v}$ is the velocity of the electrons on which the quadrupole component of the field shall have no effect.

The quadrupole lens 135 can at the same time act as beam deflector in that the electrodes 161 to 164 and the magnetic poles 165 to 168 are controlled such that dipole fields are superimposed on the quadrupole fields in order to cause the beam deflection. The control and dimensioning of the dipole fields required to this end has already been described above with reference to the deflector according to FIGS. 6 and 7.

Figure 11A:
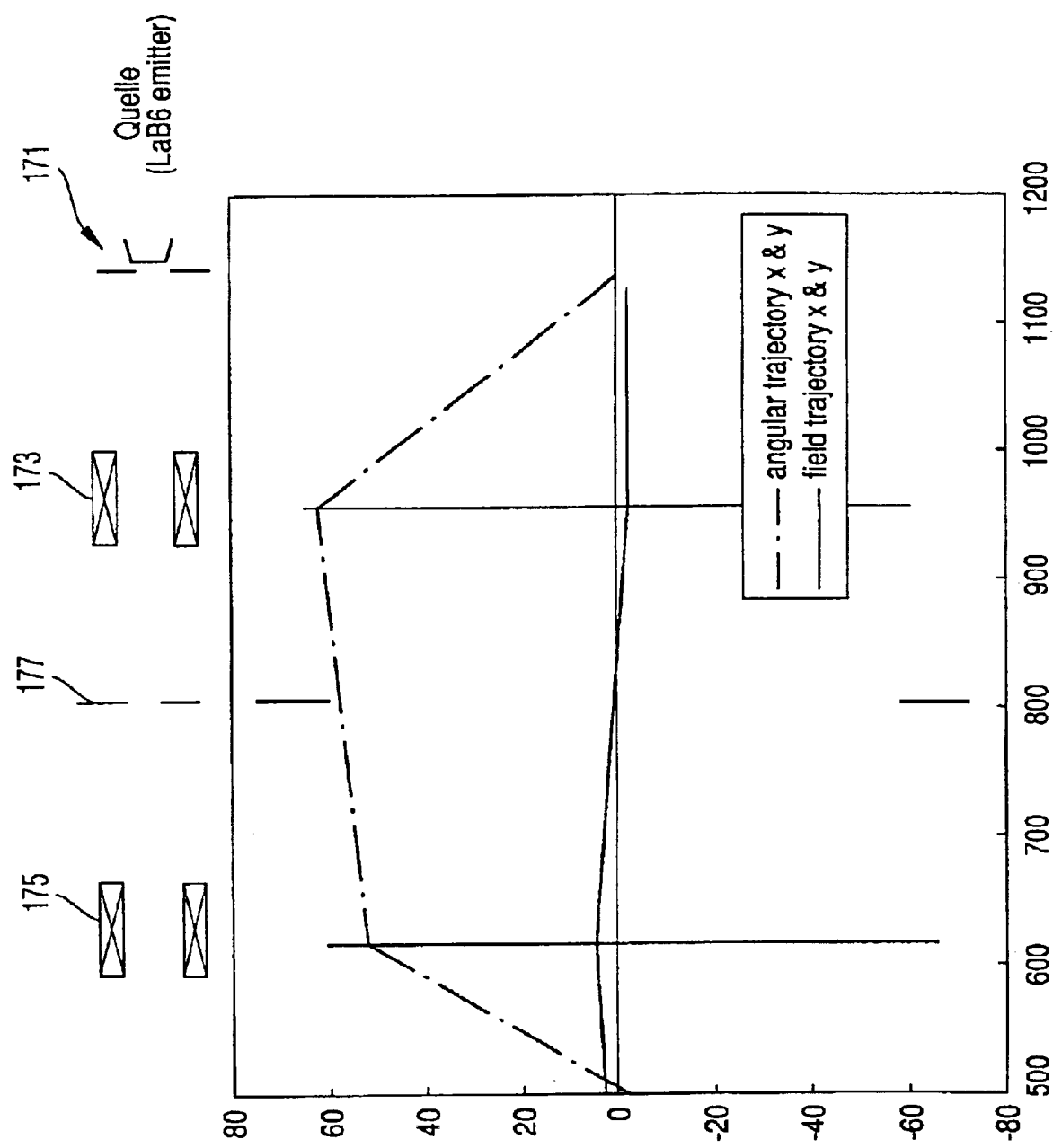
FIGS. 11a and 11b show trajectories in the illumination beam path of the microscopy system of FIG. 3.
Figure 11B:
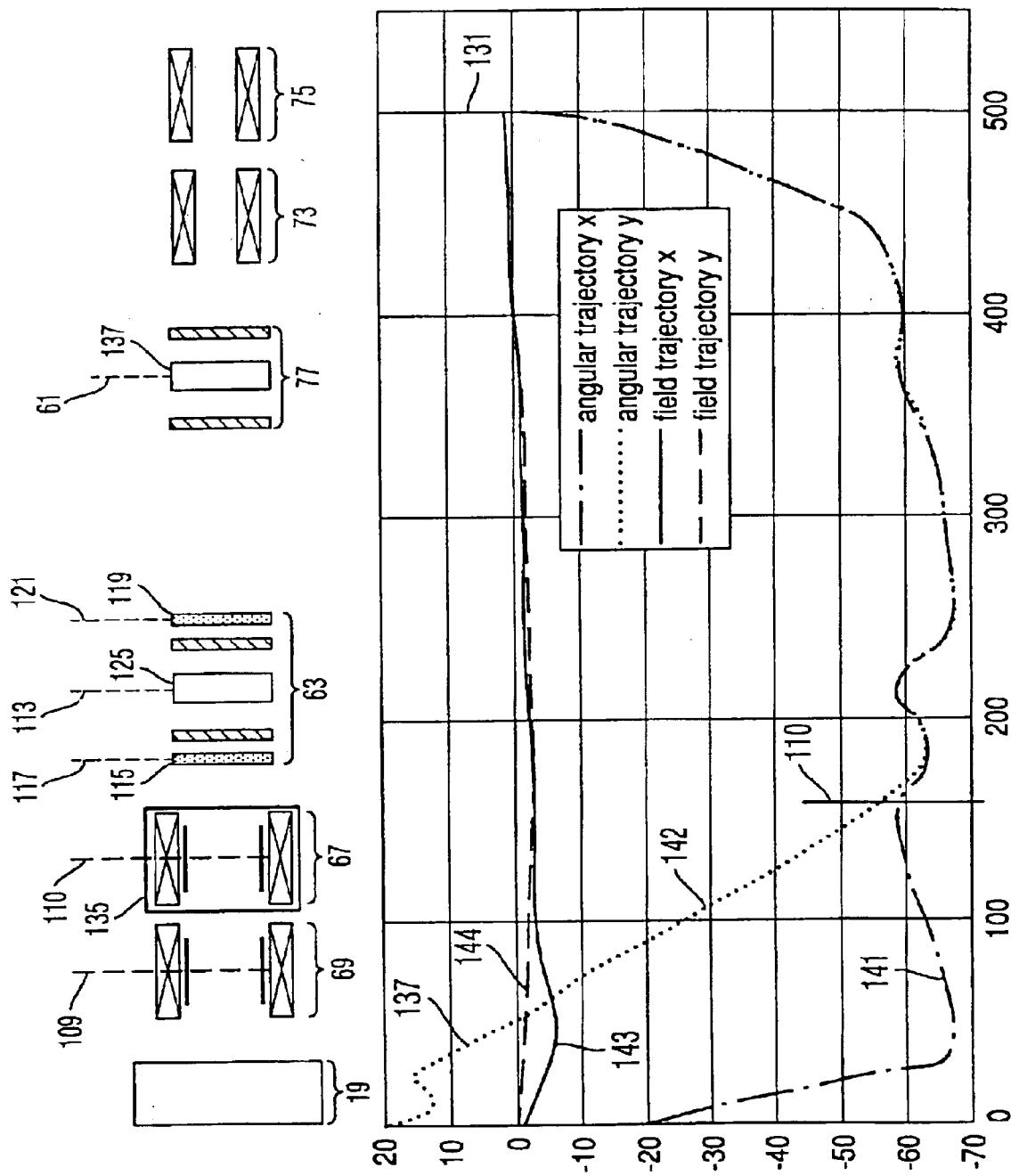

FIGS. 11a and 11b schematically illustrate the beam path of the primary electron beam 81 through the optics 11. FIG. 11b shows the beam path from the object plane 3 to a region close to the beam splitter 75, while FIG. 11a shows the beam path subsequent thereto, i.e., from the region close to the beam splitter 75 to an electron source 171. In FIGS. 11a and 11b, the diagrams at the bottom each illustrate the beam path and the upper diagrams each symbolically represent the corresponding electron-optical components. In the lower diagram a dash-dot line 141 is representative of a trajectory which emerges from electron source 171 on the axis 17 at an angle in x-direction, a dotted line 142 is representative of a trajectory which emerges from the electron source 171 on the axis 17 at an angle in y-direction, a full line 143 is representative of a trajectory which emerges from the electron source 171 at a distance in x-direction from the axis 17 parallel thereto, and a dashed line 144 is representative of a trajectory emerging from the electron source 171 at a distance in y-direction from the axis and parallel thereto.

Referring to FIG. 11a, the source 171 is disposed at a distance z=1150 mm from the object plane 3. The source is a conventional LaB6 emitter. The diverging beam emerging from the source 171 is collimated by a first collimating lens 173 at z=950 mm and a second collimating lens 175 at z=625 mm. A cross-over with a field aperture 177 is disposed at z=810 mm. As a result, a Koehler-type illumination system is provided, since the field aperture 177 is further imaged onto the object plane 3 and the field illuminated in the object plane 3 is determined by the aperture stop 177.

It is evident from the further path of the trajectories 141, 142, 143, 144 in FIG. 11b that the quadrupole lenses 119 and 115 have a relatively small influence on the primary electron beam and, as a result, the trajectories 141, 142 and 143, 144, respectively, are split to a relatively small degree. However, in the plane 110 the quadrupole lens 135 has a considerable influence on the primary electron beam 81. The trajectory 141 clearly shows the defocusing effect in x-direction; and the trajectory 142 clearly shows the focusing effect in y-direction and the formation of the line focus 137 at z=50 mm.

Figure 13A:
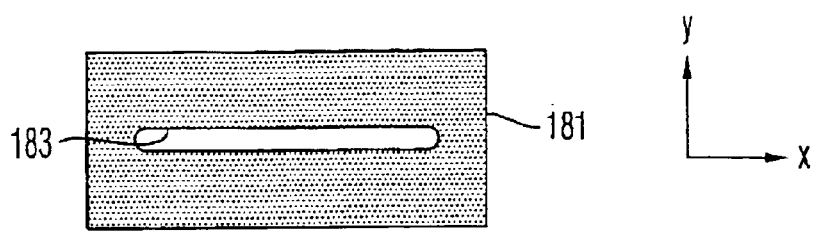
FIGS. 13a–13c illustrate aperture stops which may be used in the microscopy system according to FIGS. 4-1 and 4-2.

FIG. 13a further shows a scattering stop 181 which is disposed at z=50 mm in the beam path of the primary and secondary electrons but is not shown in FIGS. 4-1 and 4-2 for the sake of clarity. The scattering stop 181 has a slit 183 extending in x-direction which is traversed by the primary electron beam 81 and the secondary electron beam 14. The dimension of the slit 183 in x-direction is 30 mm and thus allows the deflection of the two beams 14 and 81 and adjusted by the beam deflector 67 and 69. In y-direction, the slit 183 is 200 μm wide and thus intercepts electrons of the secondary electron beam 14 having a divergence which is too high.

Figure 13B:
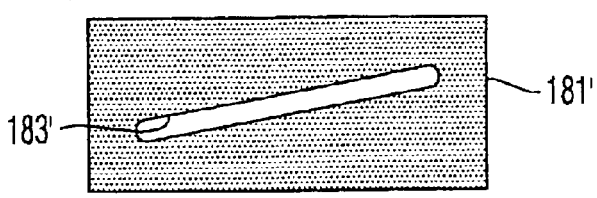

FIG. 13b shows a variant of the scattering stop 181 shown in FIG. 13a. A slit 183' of the scattering stop 181' shown in FIG. 13b is oriented obliquely in the xy-plane rather than exactly in x-direction. This scattering stop 181' is used when the object under examination is constantly moved in y-direction relative to the microscopy optics during the scanning operation. It is then possible that the primary electron beam and the secondary electron beam, respectively, "follow" the movement of the object in y-direction. At the end of a scanning operation in x-direction, the beam then returns in x-direction to start a new scanning operation.

As a result of the deflection in y-direction, the primary electron beam and the secondary electron beam then traverse the lenses of the objective lens 19 no longer exactly along the central axis thereof, but slightly offset therefrom. It is possible to adjust the field generated by the finger electrodes to this displacement in that the electrodes of a row are put as a whole on a potential which is slightly higher than those of the other row. As a result, a central axis of the field distribution formed between the two rows of finger electrodes is then also slightly shifted in respect of the geometric central axis of the objective lens 19. If the displacements of the beams in y-direction are small, a focusing effect of the objective lens 19 is still sufficient without the necessity to adjust the field distribution in y-direction.

Figure 13C:
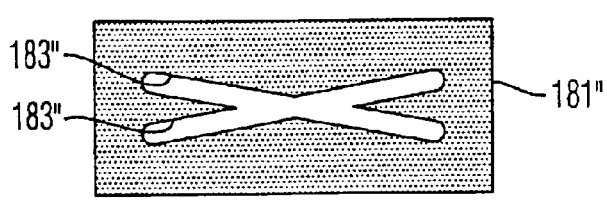

FIG. 13c shows a further variant of a scattering stop 181" which does not require the flyback in x-direction at the end of a scanning operation. To this end, two crossed slits 183" are formed in the stop 181". At the end of a scanning operation in x-direction, the beam merely skips in y-direction into the respective other slit 183", and a new scanning operation then starts in the reverse x-direction, the object being continued to be moved in y-direction.

Figure 14:
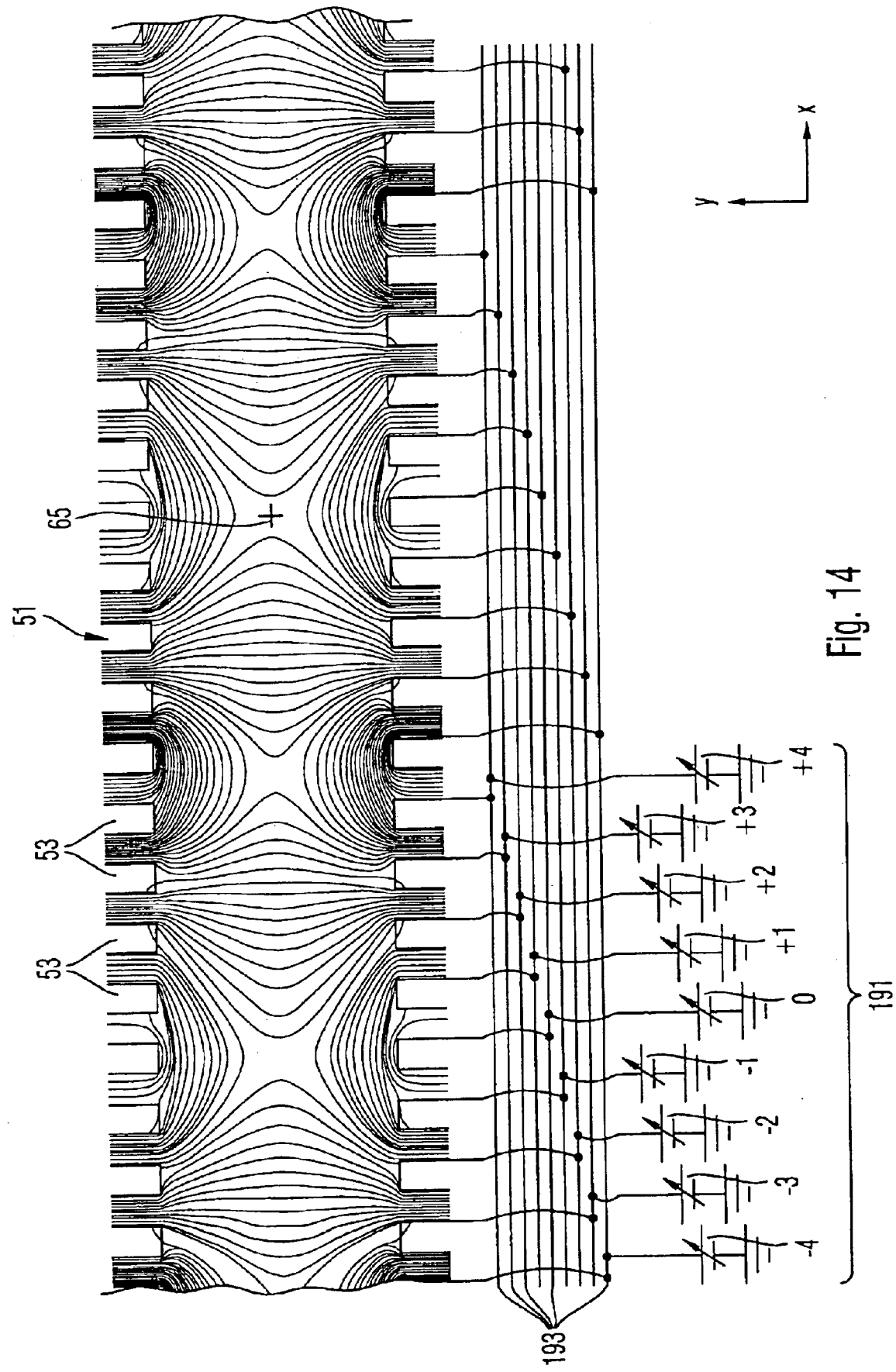
FIG. 14 is a representation of an electric circuitry for supplying a comb lens.

FIG. 14 schematically shows a driver arrangement 191 for controlling the finger electrodes 53 of the comb lens 51. The electrodes of the comb lens 51 are driven by the driver arrangement 191 such that a quadrupole-like field is provided in a region about the beam axis 65. As described above, the beam axis 65 is displaceable in x-direction and, accordingly, the voltage pattern applied to the electrodes 53 must likewise be displaced in x-direction.

The driver arrangement 191 comprises nine drivers and voltage sources, respectively, which are designated by "−4", "−3", "−2", "−1", "0", "+1", "+2", "+3", "+4". The voltage sources are separately controllable. Each of the voltage sources is connected to plural electrodes 53. However, each electrode 53 is connected only to one single voltage source. To this end, nine connecting lines 193 extend in the direction of the row, i.e., in x-direction. Each connecting line 193 is connected to a single voltage source. The electrodes 53 are then successively and periodically electrically connected with a respective other one of the connecting lines 193.

In FIG. 14, merely the driver arrangement 191 for one row of finger electrodes 53 is shown. However, a corresponding driver arrangement including connecting lines is also provided for the other row of finger electrodes 53.

Due to the relatively small number of voltage sources as compared to the number of finger electrodes 53 and due to the depicted wiring, a periodic field pattern is generated between the two rows of finger electrodes 53 although a corresponding quadrupole field must be provided merely in one region about the beam axis 63. However, a particularly small number of drivers and voltage sources, respectively, is required with the illustrated circuitry, as compared to the number of electrodes 53. By varying the voltages generated by the individual voltage sources, it is possible that the quadrupole field follows a displacement of the beam axis 65 in x-direction.

Figure 15A:
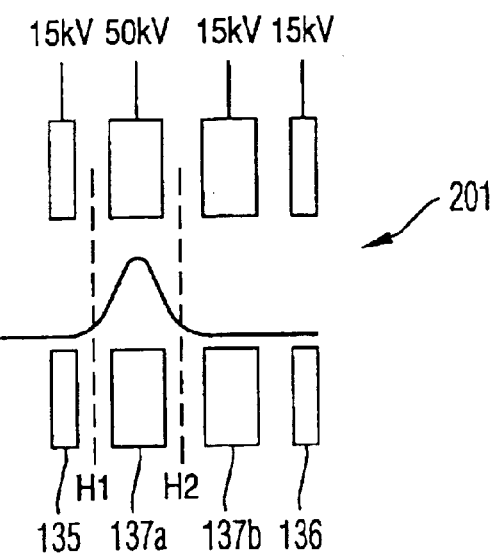
FIGS. 15a–15c illustrate a variant of an electrostatic lens which may be used in the microscopy system according to FIGS. 4-1 and 4-2.
Figure 15C:
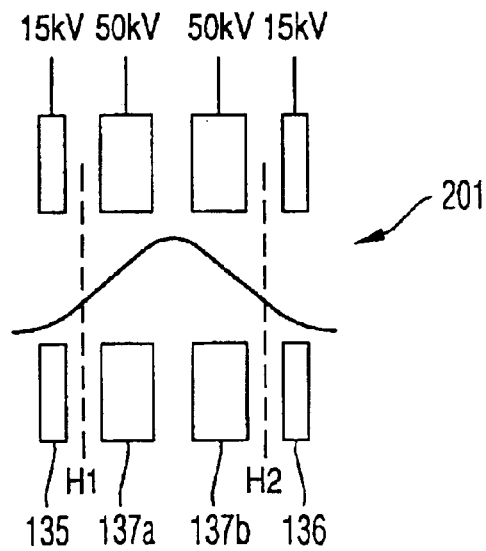
Figure 15B:
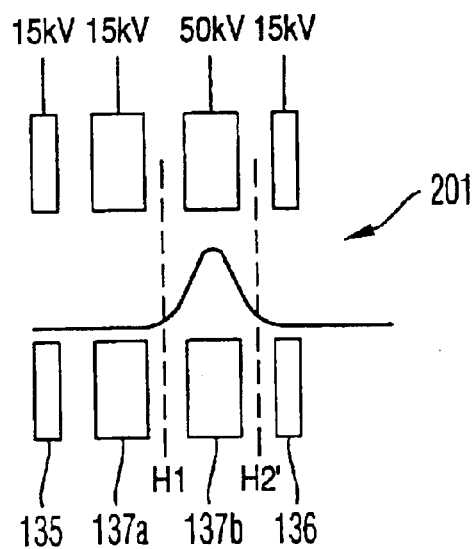

FIGS. 15a–15c show a variant of the above-described focusing lens 63. The focusing lens 201 according to FIGS. 15a–15c comprises four aperture electrodes successively disposed in z-direction, each being formed with a circular aperture opening. The electrodes may be supplied with adjustable potentials which are controlled by the controller 129. Two aperture electrodes disposed outwardly upstream and downstream, respectively, in z-direction act as screening apertures 135 and 136. Two focusing electrodes 137a and 137b are disposed therebetween at a distance from each other. By differently controlling the focusing electrodes 137a and 137b, it is possible to shift main planes H1 and H2 of the lens 201 in z-direction. FIG. 15a shows a first control mode in which the focusing electrode 137a is, for example, on a potential of 50 kV and the other electrodes 135, 137b and 136 are on a beam potential of 15 kV. The potential on the z-axis, i.e., the potential perceived by the beam passing through the lens 201, is schematically shown in FIGS. 15a–15c by a respective curve between the stop openings. Accordingly, the main planes H1 and H2 of the electron-optical lens effect provided in this control mode are located between the electrodes 135 and 137a, and 137a and 137b, respectively.

In FIG. 15b, the control mode is such that the electrodes 135, 137a and 136 are each on a beam potential of 15 kV and the focusing electrode 137b is on a potential of 50 kV. Accordingly, the main planes H1 and H2 are located between the electrodes 137a and 137b, and 137b and 136, respectively. Accordingly, as compared to FIG. 15a, the main planes H1 and H2 are displaced in z-direction, wherein the relative distance therebetween is maintained. In a further control mode shown in FIG. 15c, merely the two shielding electrodes 135 and 135 are on a beam potential of 15 kV, while both focusing electrodes 137a and 137b are put on 50 kV. As a result, the lens effect in z-direction is expanded and the two main planes H1 and H2 are located between the electrodes 135 and 137a, and 137b and 136, respectively.

The displaceability of the main planes H1, H2 of the lens 201 provides a degree of freedom for influencing the secondary electron beam in the system illustrated, in particular, with reference to FIG. 1 and FIG. 9. If the focusing lens 201 is used instead of the focusing lens 63 in FIG. 9, an additional degree of freedom for the control is then provided which allows to omit the electrostatic lens 77. The lens 77 may be replaced with a field aperture, if required.

With reference to FIGS. 10a and 10b above, a quadrupole lens has been described effecting merely primary electron beam and having substantially no effect on the secondary electron beam. The use of quadrupole lenses of transversely oriented electric and magnetic fields provides additional degrees of freedom for particle-optical systems with beams travelling in opposite directions. A further example in this respect is illustrated hereinbelow with reference to FIGS. 16 and 17.

Figure 16:
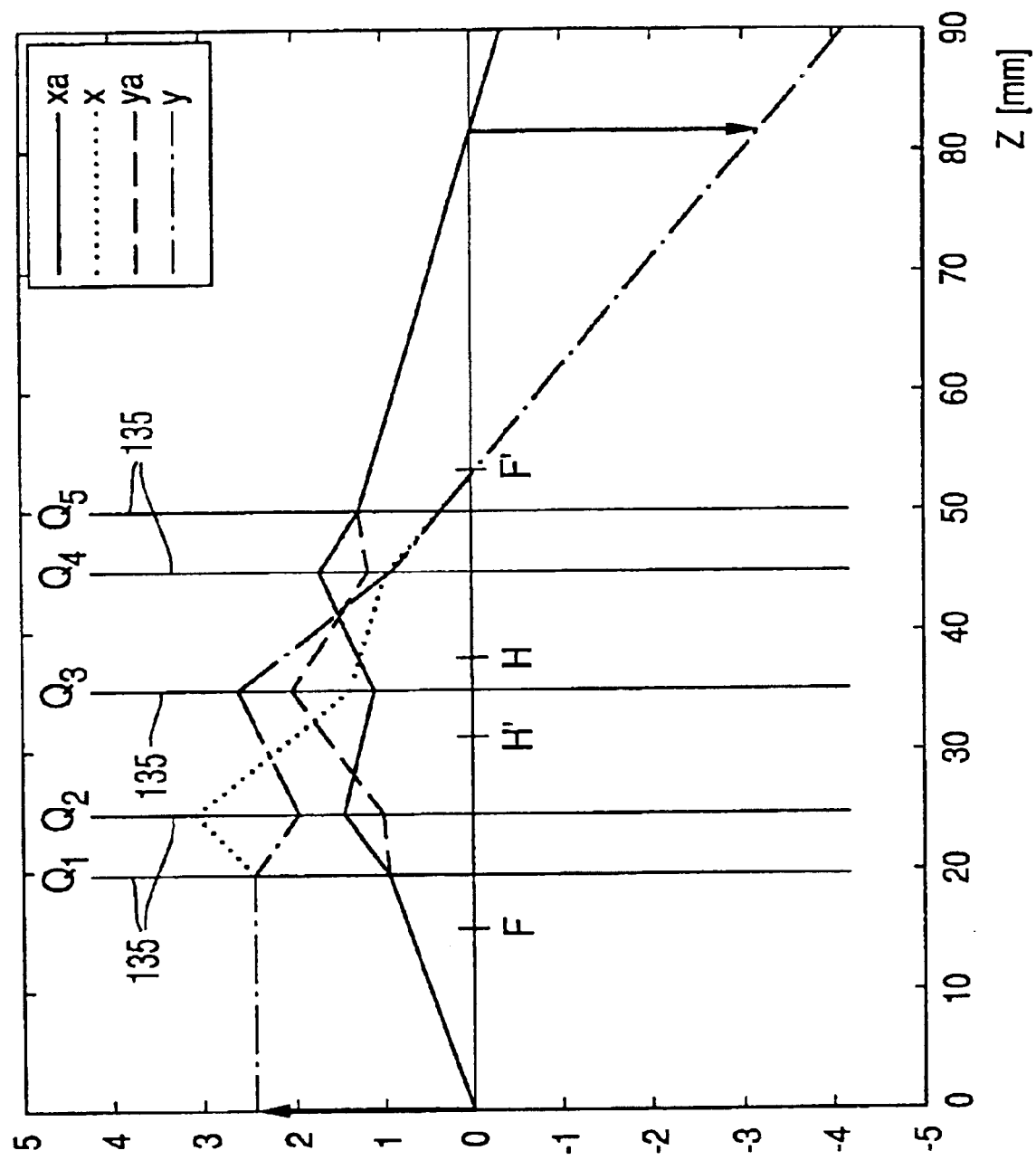
FIG. 16 shows trajectories through a beam guiding arrangement according to a further embodiment of the invention.

FIG. 16 shows an arrangement of five quadrupole lenses Q1 to Q5 which may have a structure similar to that of quadrupole lens 135 shown in FIG. 12 having transversely oriented electric and magnetic fields. The focal widths and positions of the five quadrupole lenses along a beam axis or in z-direction are indicated in the following table:

|        | Q1     | Q2 | Q3     | Q4 | Q5     |
|--------|--------|----|--------|----|--------|
| f [mm] | −22.48 | 11 | −10.89 | 11 | −22.48 |
| z [mm] | 20     | 25 | 35     | 45 | 50     |

FIG. 16 shows in analogy to the representation according to FIG. 9 the field and angular trajectories, for a first beam which emanates from an object plane disposed at z=0. It is evident that an image of the object plane is generated in an image plane at z=82 mm. Accordingly, the effect which the arrangement of the five quadrupole lenses has on the first beam is an effect of a thick round lens with a focal width f=22 or a magnification of 1.3.

Figure 17:
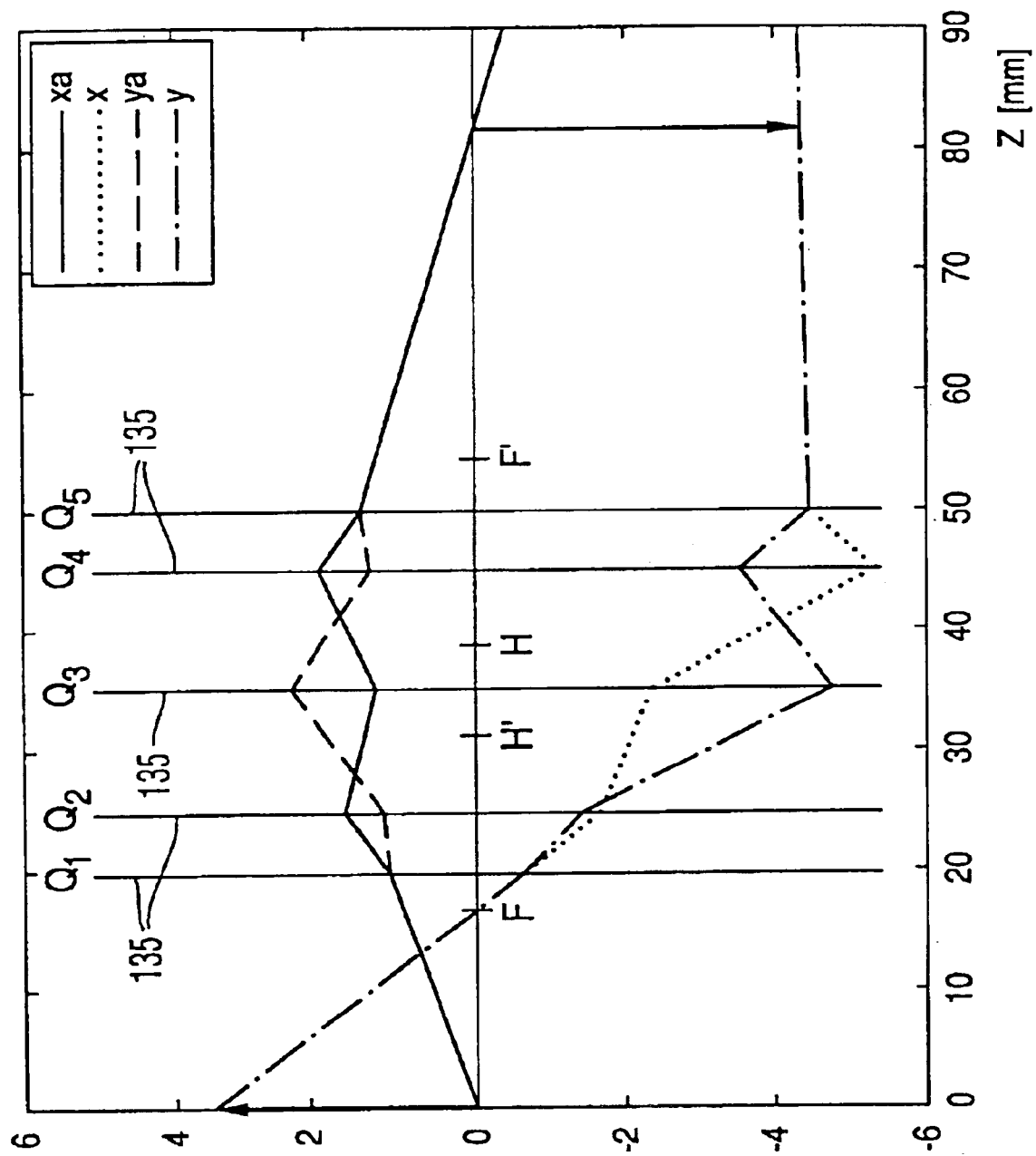
FIG. 17 shows further trajectories through the beam guiding arrangement illustrated in FIG. 16.

FIG. 17 shows a beam path in analogy to the representation of FIGS. 11a and 11b, namely for a beam which passes through the five quadrupole lenses in the second direction opposed to the first beam. FIG. 17 shows the axial and field trajectories for the second beam starting from the image plane at z=82 mm. It is apparent that the effect which the arrangement of the five quadrupoles has on the second beam is that of a round lens with a focal length of 22 mm or a magnification of 1/1.3.

It is apparent from FIGS. 16 and 17 that the arrangement of the five quadrupole lenses has the same effect on both beams, namely the effect of a thick round lens with the main planes at H=38 mm, H'=32 mm and focus points at F=17 mm and F'=53 mm. This results in a focal length of about 22 mm.

Figure 18:
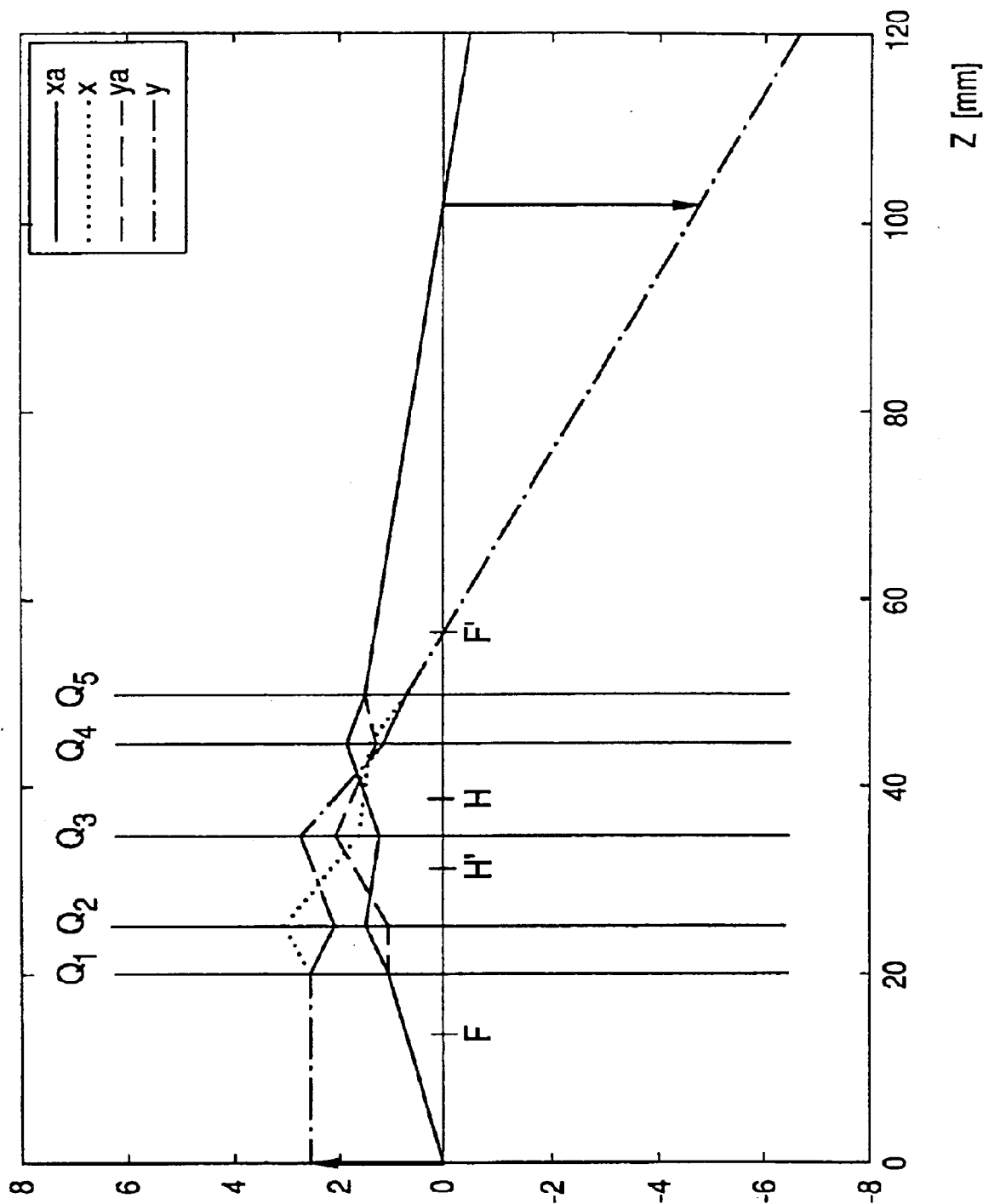
FIG. 18 shows trajectories through a beam guiding arrangement according to a variant of FIG. 16.
Figure 19:
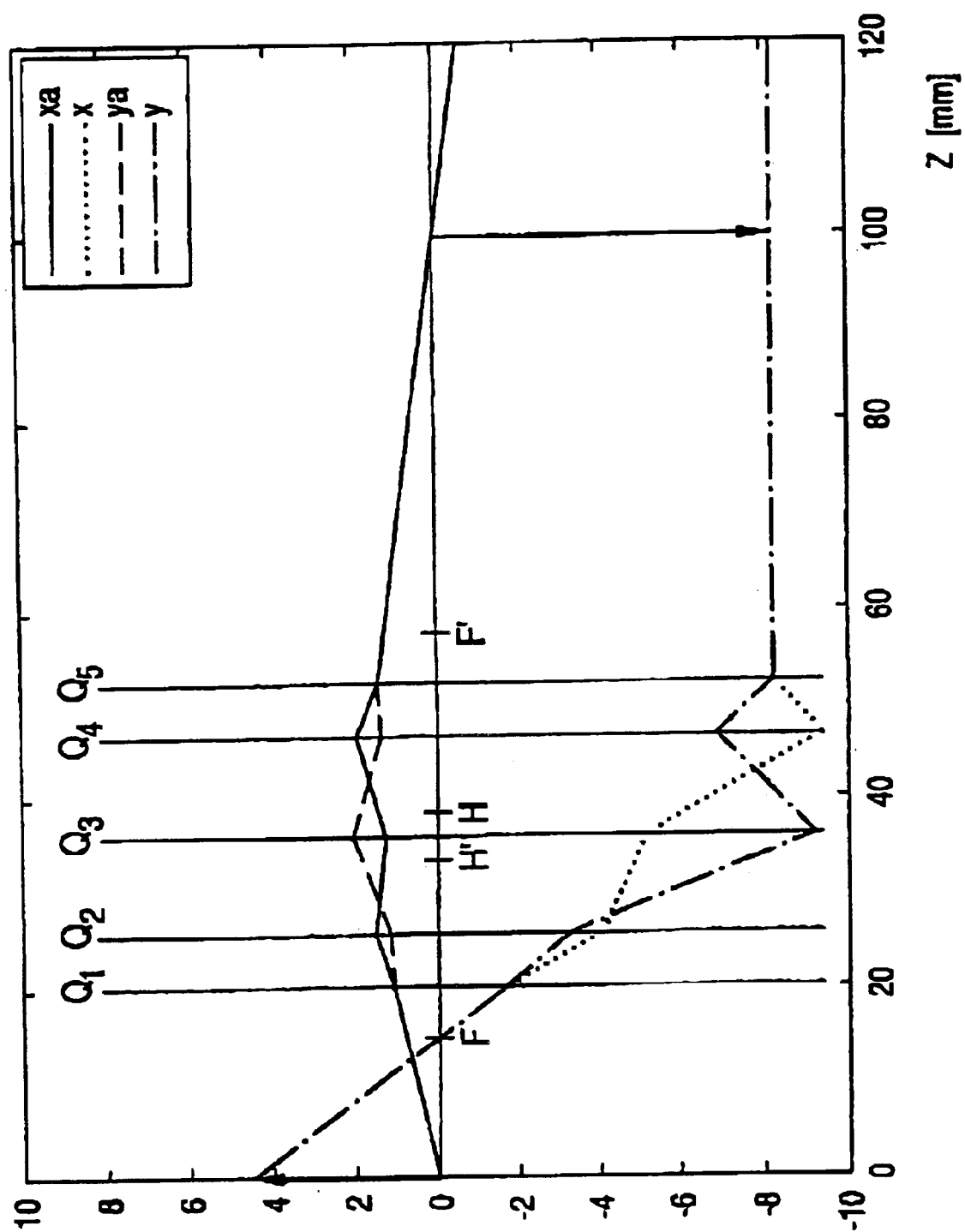
FIG. 19 shows further trajectories through the beam guiding arrangement illustrated in FIG. 18.

FIGS. 18 and 19 show a variant of the quadrupole arrangement shown in FIG. 16, the positions of the quadrupoles in z-direction being the same, the focal widths, however, being modified due to a modified excitation of the lenses, as it is evident from the following table:

|        | Q1     | Q2 | Q3     | Q4 | Q5     |
|--------|--------|----|--------|----|--------|
| f [mm] | −22.92 | 12 | −11.63 | 12 | −24.92 |
| Z [mm] | 20     | 25 | 35     | 45 | 50     |

Accordingly, main planes H'=32 mm, H=38 mm, magnifications M=1.8 and M'=1/1.8 and a total focal length of 24 mm are obtained.

The arrangement of five quadrupoles illustrated in FIGS. 16 to 18 allows to provide a function of a round lens which is in the first order distortion-free, in the first order stigmatic and which has a focus which is for both beam directions selectively adjustable.

A plurality of degrees of freedom is generated, accordingly. In particular, the quadrupole lenses can be energized such that substantially no effect is generated on one of the two beams. Moreover, the lenses can be excited such that a lens effect is provided on both beams. The lens effect may provide a same focal length to both beams even when the two have different energies.

Moreover, it is possible to reduce the number of quadrupole lenses in the arrangement, which would, however, result into a loss of imaging quality. Nevertheless, the arrangement then still provides the advantages to selectively provide specific lens effects on the one or the other beam or on both beams. For example, it is possible to provide an imaging property with merely two quadrupoles. Such imaging may be stigmatic in the first order. It then no longer provides displaceable foci and is then no longer distortion-free.

In the above-described examples, the strengths of the electric and magnetic quadrupole fields are adjusted such that for each of the beams travelling in opposite directions qudarupole lens effects are provided.

However, it is also possible to adjust the electric and magnetic field strengths such that one of the two beams is not subjected to any quadrupole lens effects. In this case, the electric and magnetic fields of each one of the quadrupole lenses shall be adjusted such that they satisfy the formula $$\vec{E} = -\vec{v} \times \vec{B},$$

wherein $\vec{v}$ is the velocity of the electrons of the beam which is not to be influenced.

A specific adjustment of the electric and magnetic fields is also given when both beams are subjected to a substantially equal quadrupole lens effect. To this end, the quadrupole components of the electric and magnetic fields of each lens must be adjusted such that they fulfil the relation $$B(E) = \frac{V_{z1} - V_{z2}}{V_{z1} \cdot V_{z2}} \cdot E$$

wherein $V_{z1}$ is the velocity of the primary electrons and $V_{z2}$ is the velocity of the secondary electrons.

Apart from the above-described specific settings, i.e., a setting wherein substantially no influence is provided on one of the two beams or a setting wherein substantially the same influence is provided on both beams, it is, however, also possible to provide quadrupole effects for both beams which are different from one another in a well defined and adjustable manner.

Moreover, it is possible to use, instead of the quadrupole lenses illustrated above, lenses with a higher symmetry, for example, hexapole symmetry, and to likewise selectively influence the one or the other beam or both beams.

The energy filter described above with reference to FIGS. 4-1 and 4-2 is a conventional energy filter of the Ω-type. Alternatively, it is also possible to use an energy filter of the conventional α-type.

The above-described comb lens comprises as source members electrodes as sources of electric fields. As an alternative thereto, it is also possible to apply the concept to magnetic field source members. The field source members are then magnetic pole pieces which, for example, are energized by a plurality of coils, having drivers which are sources of adjustable currents.

The embodiments illustrated above relate to electron microscopy systems. However, it is also possible to apply the concepts of the invention to a lithography system as it is illustrated hereinafter with reference to FIG. 20.

Figure 20:
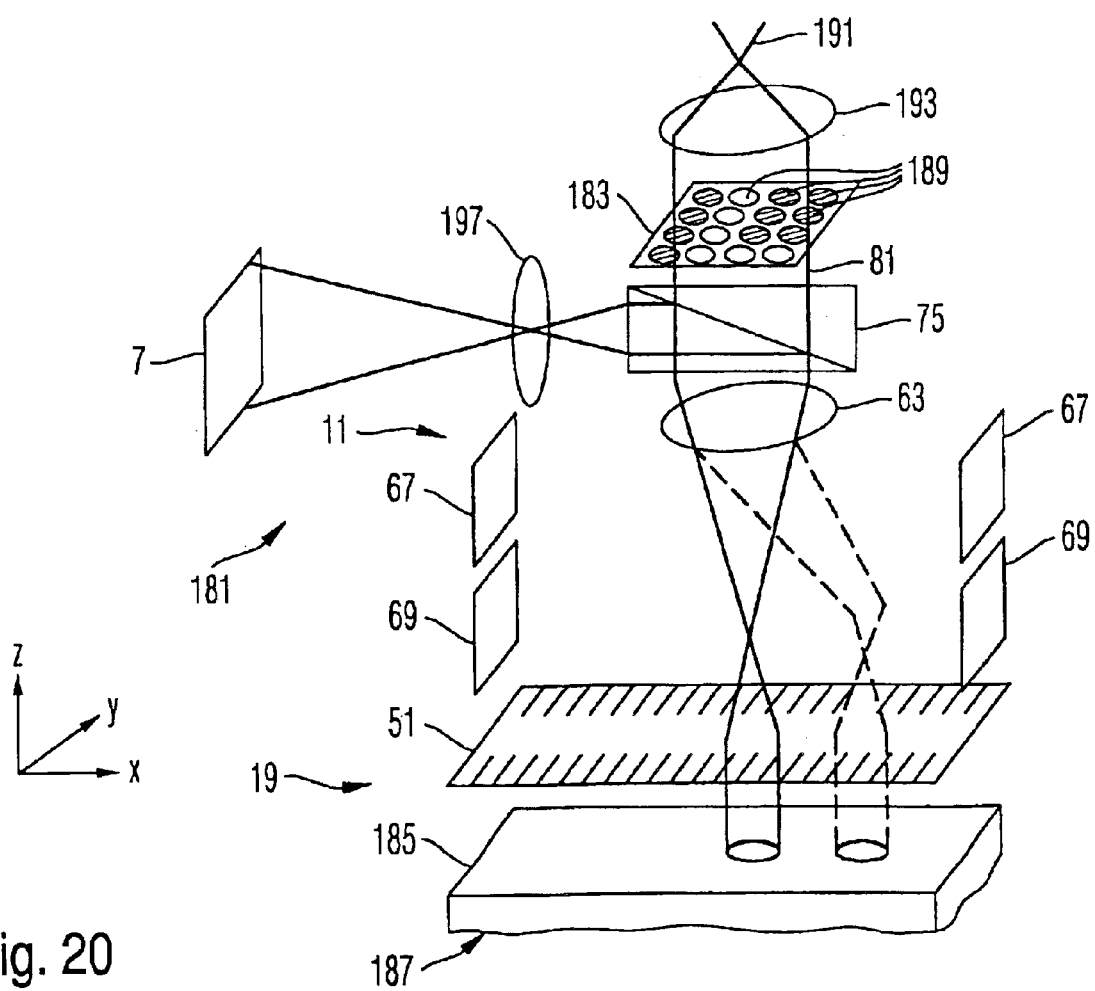
FIG. 20 is a schematic representation in perspective view of a lithographic system according to an embodiment of the invention.

FIG. 20 schematically shows an exemplary electron lithography system 181 having a structure which represents a modification of the microscopy system shown in FIGS. 4-1 and 4-2. The lithography system 181 comprises a first beam shaper 19 having a comb lens 51 for providing a quadrupole-like field which is displaceable in an x-direction, and having additional slit lenses which are not incorporated in the representation of FIG. 19. The lithography system 181 further comprises two beam deflectors 67 and 69 disposed spaced apart from each other in z-direction, and a second beam shaper 63 which serves, in similar way as described above for the microscopy system according to FIGS. 4-1 and 4-2, to compensate for a remaining quadrupole effect of the first beam shaper 19. The primary electron beam 81 projects a pattern provided by a lens system 183 onto a radiation-sensitive layer 185 (resist) of a semiconductor wafer 187 to be manufactured and which is disposed in an object plane of the electron optics.

The lens arrangement 183 comprises a plurality of separate individual lenses 189 disposed in a field which are controllable independently of each other and are capable of selectively switching a primary electron beam on and off in their lens regions. The primary electron beam is generated by an electron source 191 and collimated by a collimating lens 193. Such type of lens arrangement is, for example, known from U.S. Pat. No. 6,323,499 B1, the full disclosure of which is incorporated herein by reference. Therefore, the lens arrangement 183 is not fully described herein for the sake of brevity.

The lithography system 181 allows to write exposure patterns on the radiation-sensitive layer 185 with the primary electron beam 81, wherein the pattern written on the layer 185 may be freely configured by switching the individual lenses 189 on and off and by scanning the primary electron beam 81 across the layer 185 using the beam deflectors 67 and 69. Due to the switchable lens system 183, the lithography system is a so-called "maskless" lithography system. However, it is also possible to use, instead of the switchblade lens system 183, a prefabricated mask, such as a scattering mask and a stencil mask, for defining the patterns to be imaged onto the wafer.

FIG. 20 further shows an optional characteristic of the lithographic system 181. The optics 11 can be configured such that secondary electrons released from the radiation-sensitive layer 185 by the writing beam 81 are returned by the optics 11. They are then separated from the beam path of the primary electron beam 81 in a beam splitter 75 and imaged by a further lens arrangement 197, illustrated only schematically in FIG. 20, onto a detector 7. The detector may be a position-sensitive detector and allows detection of a secondary electron intensity signal which may be a position dependent signal. The writing procedure may be monitored, accordingly. In particular, it may be determined whether the individual lenses 189 of the lens arrangement 181 are satisfactorily working.

In summary, an electron microscopy system is provided having an objective lens which images a field displaceable in x-direction onto a fixed beam axis. The objective lens has an astigmatic effect which is compensated for by a beam shaper on the fixed axis.

Moreover, lens configurations are proposed which can selectively act on the primary electron beam or on the secondary electron beam.

The present invention has been described by way of exemplary embodiments to which it is not limited. Variations and modifications will occur to those skilled in the art without departing from the scope of the present invention as recited in the appended claims and equivalents thereof.

What is claimed is:

1. A beam guiding arrangement for manipulating a beam of charged particles, the system comprising:
   a first beam shaper traversed by the beam along a first beam axis;
   a second beam shaper traversed by the beam along a second beam axis; and
   at least one beam deflector disposed between the first beam shaper and the second beam shaper, for displacing the first beam axis in a first direction;
   wherein the first beam shaper is configured to provide a beam shaping field acting on the beam and comprising a field component having a quadrupole symmetry with respect to an axis of symmetry which is displaceable in the first direction,
   wherein a focusing effect of the first beam shaper on the beam in a second direction is different from a focusing effect of the first beam shaper on the beam in a third direction oriented orthogonally to the second direction, and
   wherein the second beam shaper is configured to provide a beam shaping field acting on the beam and comprising a field component with a quadrupole symmetry, and wherein a focusing effect of the second beam shaper on the beam in the second direction is different from a focusing effect of the second beam shaper on the beam in the third direction.

2. The beam guiding arrangement according to claim 1, wherein the second direction is oriented substantially parallel to the first direction.

3. The beam guiding arrangement according to claim 1, wherein the first beam shaper comprises a slit lens having an aperture elongated substantially in the first direction, for focusing the beam in a direction oriented transversely to the first direction.

4. The beam guiding arrangement according to claim 1, wherein the second beam shaper comprises two quadrupole lenses spaced apart from each other along the second beam axis.

5. The beam guiding arrangement according to claim 4, wherein the two quadrupole lenses have a focusing effect on the beam in planes oriented transversely to each other.

6. The beam guiding arrangement according to claim 4, wherein the second beam shaper comprises a round lens located between the two quadrupole lenses.

7. The beam guiding arrangement according to claim 6, wherein the round lens has at least one main plane which is displaceable in a direction of a main axis of the round lens.

8. The beam guiding arrangement according to claim 1, wherein a scattering stop having an elongated aperture extending substantially in the first direction is provided between the first and the second beam shapers.

9. An electron microscopy system for generating an image of an object plane, the electron microscopy system comprising:
   the beam guiding arrangement according to claim 1, provided between the object plane and an intermediate image plane of the electron microscopy system;
   an electron source for generating a beam of primary electrons; and
   an electron detector for receiving the image.

10. The electron microscopy system according to claim 9, further comprising an energy filter disposed in a beam path of a secondary electron beam downstream of the intermediate image plane.

11. The electron microscopy system according to claim 10, wherein at least one round lens is provided between the second beam shaper and the energy filter.

12. The electron microscopy system according to claim 10, wherein an electrostatic round lens is located at the intermediate image plane.

13. The electron microscopy system according to claim 10, wherein a field aperture is provided near the intermediate image plane.

14. The electron microscopy system according to claim 10, wherein the energy filter provides a beam-splitter function to separate a beam path of the secondary electron beam from a beam path of the primary electron beam.

15. The electron microscopy system according to claim 10, wherein a position-sensitive electron detector is provided in the beam path of the secondary electron beam downstream of the energy filter.

16. A method of imaging an object field which is displaceable in an object plane in a first direction into an image field which is substantially stationary in a first intermediate image plane using a beam of charged particles, the method comprising:

providing a first quadrupole field on a first beam axis in a region near the object plane, wherein the first quadrupole field focuses the beam of charged particles emanating from the object plane in a second direction and defocuses the beam of charged particles in a third direction oriented orthogonally to the second direction;

deflecting the beam of charged particles, after the same has traversed the first quadrupole field along the first beam axis, such that, after the deflection, the beam of charged particles extends along a second beam axis;

providing a second quadrupole field on the second beam axis; and displacing the first beam axis in the first direction relative to the second beam axis.

17. The method according to claim 16, further comprising changing a field strength of the first quadrupole field in dependence of a displacement of the first beam axis.

18. The method according to claim 16, further comprising changing a strength of the second quadrupole field dependent upon the displacement of the first beam axis relative to the second beam axis.

19. The method according to claim 16, further comprising providing at least one cylinder lens field in a region near the object plane, wherein the cylinder lens field focuses the beam of charged particles emanating from the object plane in the second direction.

20. The method according to claim 19, further comprising changing a strength of the at least one cylinder lens field in dependence of the displacement of the first beam axis relative to the second beam axis.

21. The method according to claim 16, further comprising:

providing a third quadrupole field on the second beam axis spaced apart along the second beam axis from the second quadrupole field; and changing a field strength of the third quadrupole field in dependence of the displacement of the first beam axis relative to the second beam axis.

22. The method according to claim 16, further comprising providing a first round lens field in respect of the second beam axis and changing a strength of the first round lens field dependent upon the displacement of the first beam axis.

23. The method according to claim 22, wherein the first intermediate image is imaged in a second intermediate image and wherein the method further comprises:

providing a second round lens field on the second beam axis; and changing a field strength of the second round lens field in dependence of the displacement of the first beam axis relative to the second beam axis.

24. The method according to claim 23, further comprising providing a third round lens field between the first intermediate image and the second intermediate image, and changing a strength of the third round lens field in dependence of the displacement of the first beam axis relative to the second beam axis.

25. A beam guiding arrangement for guiding a first beam of charged particles having a first beam direction and a second beam of charged particles having a second beam direction opposite to the first beam direction, wherein the beam guiding arrangement is configured to have a total effect of a particle-optical lens on each of the two beams of charged particles, the beam guiding arrangement comprising:

at least one particle-optical lens having a field region in which a magnetic field and an electric field are superimposed such that directions of the magnetic field and the electric field are substantially orthogonal to each other at plural positions in the field region, wherein the electric field and the magnetic field comprise a component of a multipole order greater than or equal to two, and wherein the at least one particle-optical lens is arranged to pass a majority of charged particles of the first beam of charged particles and a majority of charged particles of the second beam of charged particles therethrough.

26. The beam guiding arrangement according to claim 25, wherein charged particles of one of the first and second beams of charged particles have a predetermined kinetic energy, and wherein a strength of the magnetic field and a strength of the electric field of the at least one particle-optical lens are adjusted according to the predetermined kinetic energy such that said one of the first and second beams of charged particles substantially traverses the lens without experiencing one of a focusing effect, a defocusing effect, and a quadrupole effect.

27. The beam guiding arrangement according to claim 25, wherein the charged particles of said one of the first and second beams of charged particles have a predetermined first kinetic energy and charged particles of the other of the first and second beams of charged particles have a second kinetic energy different from the first kinetic energy, and wherein the strength of the magnetic field and the strength of the electric field of the at least one particle-optical lens are adjusted according to the first and the second kinetic energies such that the at least one particle-optical lens provides substantially a same optical effect on the first beam of charged particles and the second beam of charged particles, the optical effect being one of a focusing effect, a defocusing effect and a quadrupole effect.

28. The beam guiding arrangement according to claim 25, wherein the electric field and the magnetic field have substantially a quadrupole symmetry.

29. The beam guiding arrangement according to claim 28, wherein one of two, three, four, five, and more than five particle-optical lenses are provided, each particle-optical lens having substantially a quadrupole symmetry, the particle-optical lenses being located spaced apart from each other.

30. An electron microscopy system for generating an image of an object plane, the electron microscopy system comprising:

an electron source for generating a beam of primary electrons;

an electron detector for receiving the image; and at least one particle-optical lens which is traversed by the beam of primary electrons in a first direction and by a secondary electron beam in a second direction opposed to the first direction, wherein the at least one particle-optical lens is configured to provide a field region in which a magnetic field and an electric field are superimposed such that directions of the magnetic field and the electric field are oriented substantially orthogonal to each other at plural positions in the field region, wherein the electric and the magnetic fields have a multipole symmetry higher than a dipole symmetry, and wherein the at least one particle-optical lens is arranged to pass a majority of the primary electrons and a majority of electrons of the secondary electron beam therethrough.

31. The electron microscopy system according to claim 30, wherein secondary electrons of the secondary electron beam, when traversing the lens, have a substantially predetermined kinetic energy, and wherein a strength of the magnetic field and a strength of the electric field are adjusted according to the predetermined kinetic energy such that the secondary electron beam is substantially not influenced by the lens.

32. The electron microscopy system according to claim 30, wherein the primary electron beam downstream of the particle-optical lens is a beam which is convergent in a first plane.

33. The electron microscopy system according to claim 32, wherein the primary electron beam traverses a line focus located downstream of the lens and upstream of the object plane, wherein the line focus is oriented orthogonal to the first plane.

34. The electron microscopy system according to claim 32, wherein the primary electron beam downstream of the particle-optical lens is a beam which is divergent in a second plane orthogonal to the first plane.

35. The electron microscopy system according to claim 30, comprising a beam guiding arrangement configured to have particle-optical lens effect on both the secondary electron beam and the beam of primary electrons, the beam guiding arrangement comprising the at least one particle-optical lens.

36. A method of operating an electron microscopy system comprising electron optics which provides a common beam path for a primary electron beam and a secondary electron beam, the method comprising:

passing a majority of electrons of the primary electron beam and a majority of electrons of the secondary electron beam through at least one particle-optical lens, the at least one particle-optical lens being configured to provide a field region in which a magnetic field and an electric field are superimposed such that directions of the magnetic field and the electric field are oriented substantially orthogonal to each other at plural positions in the field region, wherein the electric and the magnetic fields have a multipole symmetry higher than a dipole symmetry; and changing selectively trajectories of electrons of a first one of the primary electron beam and the secondary electron beam using the at least one particle optical lens, while trajectories of electrons of a second one of the primary electron beam and the secondary electron beam remain substantially unchanged through the at least one particle optical lens.

37. A method of operating an electron microscopy system comprising electron optics which provides a common beam path for a primary electron beam and a secondary electron beam, comprising:

changing trajectories of electrons of the primary electron beam and the secondary electron beam, wherein substantially a same lens effect is provided for both the primary and secondary electron beams, the effect being at least one of a focusing effect, a defocusing effect and a quadrupole effect.

38. An electron lithography system for transferring a pattern onto a particle sensitive substrate, comprising:

the beam guiding arrangement according to claim 1; and an electron source for generating a writing electron beam.

39. An electron lithography system for transferring a pattern onto a particle sensitive substrate, comprising:

the beam guiding arrangement according to claim 25; and an electron source for generating a writing electron beam.

40. The method according to claim 16, wherein the first intermediate image is imaged in a second intermediate image and wherein the method further comprises:

providing a round lens field on the second beam axis; and changing a field strength of the round lens field in dependence of the displacement of the first beam axis relative to the second beam axis.

41. The beam guiding arrangement according to claim 25, comprising a beam adjusting arrangement proximate to the at least one particle-optical lens, wherein the at least one particle-optical lens is arranged relative to the beam adjusting arrangement such that a majority of charged particles of the second beam of charged particles pass through the at least one particle-optical lens.

42. The electron microscopy system according to claim 30, comprising a beam adjusting arrangement proximate to the at least one particle-optical lens, wherein the at least one particle-optical lens is arranged relative to the beam adjusting arrangement such that a majority of electrons of the secondary electron beam pass through the at least one particle-optical lens.

43. A beam guiding arrangement for guiding a first beam of charged particles having a first beam direction and a second beam of charged particles having a second beam direction opposite to the first beam direction, wherein the beam guiding arrangement is configured to have a total effect of a particle-optical lens on each of the two beams of charged particles, the beam guiding arrangement comprising:

a plurality of particle-optical lenses each having a field region in which a magnetic field and an electric field are superimposed such that directions of the magnetic field and the electric field are substantially orthogonal to each other at plural positions in the field region, wherein the electric field and the magnetic field of each particle-optical lens have substantially a quadrupole symmetry, the particle-optical lenses being located spaced apart from each other.

44. The beam guiding arrangement of claim 43, wherein the beam guiding arrangement has five of said particle-optical lenses.

* * * * *